(12) United States Patent
Koizumi et al.

(10) Patent No.: US 9,735,380 B2
(45) Date of Patent: Aug. 15, 2017

(54) TRANSISTOR MANUFACTURING METHOD AND TRANSISTOR

(71) Applicant: NIKON CORPORATION, Tokyo (JP)

(72) Inventors: Shohei Koizumi, Atsugi (JP); Takashi Sugizaki, Yokohama (JP); Yusuke Kawakami, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/154,160

(22) Filed: May 13, 2016

(65) Prior Publication Data

US 2016/0254466 A1 Sep. 1, 2016

Related U.S. Application Data

(63) Continuation of application No. PCT/JP2014/080769, filed on Nov. 20, 2014.

(30) Foreign Application Priority Data

Nov. 21, 2013 (JP) ................. 2013-240560

(51) Int. Cl.
*H01L 51/30* (2006.01)
*H01L 51/05* (2006.01)
(Continued)

(52) U.S. Cl.
CPC ...... *H01L 51/0529* (2013.01); *C23C 18/2086* (2013.01); *C23C 18/31* (2013.01);
(Continued)

(58) Field of Classification Search
CPC ............ H01L 29/4908; H01L 51/0529; H01L 21/823437; H01L 21/823462
(Continued)

(56) References Cited

U.S. PATENT DOCUMENTS

2005/0059193 A1* 3/2005 Yoneya ............ H01L 21/32051
438/151
2008/0265244 A1* 10/2008 Sirringhaus ............ B82Y 10/00
257/40
(Continued)

FOREIGN PATENT DOCUMENTS

JP 2008-208389 9/2008

OTHER PUBLICATIONS

International Search Report dated Feb. 3, 2015 in corresponding International Patent Application No. PCT/JP2014/080769.
International Written Opinion of the International Searching Authority dated Feb. 3, 2015 in corresponding International Patent Application No. PCT/JP2014/080769.

*Primary Examiner* — George Fourson, III

(57) ABSTRACT

A transistor manufacturing method includes: forming a first insulator layer of which formation material is a fluorine-containing resin, on a substrate having a source electrode, a drain electrode, and a semiconductor layer so as to cover the semiconductor layer; forming a second insulator layer so as to cover the first insulator layer; forming a base film on at least part of a surface of the second insulator layer; and after depositing a metal which is an electroless plating catalyst on a surface of the base film, forming a gate electrode on the surface of the base film by electroless plating, wherein the forming of the base film is performed by applying a liquid substance which is a formation material of the base film to the surface of the second insulator layer, and the second insulator layer has a higher lyophilic property with respect to the liquid substance than the first insulator layer.

17 Claims, 18 Drawing Sheets

(51) Int. Cl.
  *C23C 18/31* (2006.01)
  *C23C 18/32* (2006.01)
  *H01L 29/786* (2006.01)
  *C23C 18/20* (2006.01)
  *H01L 51/00* (2006.01)
  *H01L 29/49* (2006.01)
  *H01L 21/8234* (2006.01)

(52) U.S. Cl.
  CPC ............ C23C 18/32 (2013.01); H01L 29/786 (2013.01); H01L 51/0017 (2013.01); H01L 51/052 (2013.01); H01L 51/055 (2013.01); H01L 51/0541 (2013.01); *H01L 21/823437* (2013.01); *H01L 21/823462* (2013.01); *H01L 29/4908* (2013.01)

(58) Field of Classification Search
  USPC .......................................... 257/411; 438/161
  See application file for complete search history.

(56) References Cited

U.S. PATENT DOCUMENTS

| | | | |
|---|---|---|---|
| 2010/0084643 A1* | 4/2010 | Hirai | H01L 51/0529 257/40 |
| 2011/0227055 A1* | 9/2011 | Carrasco-Orozco | C23C 14/086 257/40 |
| 2012/0143568 A1* | 6/2012 | Kagan | A61N 1/36082 702/189 |
| 2012/0313086 A1* | 12/2012 | Sadamitsu | C07D 495/04 257/40 |
| 2016/0072086 A1* | 3/2016 | Okamoto | H01L 51/105 257/40 |
| 2016/0351839 A1* | 12/2016 | Niori | H01L 51/0012 |
| 2017/0012220 A1* | 1/2017 | Tsuyama | H01L 51/0074 |

* cited by examiner (a)

(b)

(a) TRANSFER PROPERTY (b) OUTPUT PROPERTY

TRANSISTOR MANUFACTURING METHOD AND TRANSISTOR

CROSS-REFERENCE TO RELATED APPLICATION

This is a Continuation Application of International Application No. PCT/JP2014/080769, filed on Nov. 20, 2014, which claims priority on Japanese Patent Application No. 2013-240560, filed on Nov. 21, 2013. The contents of the aforementioned applications are incorporated herein by reference.

BACKGROUND

Field of the Invention

The present invention relates to a transistor manufacturing method and a transistor.

Background

In the related art, considerations have been made in which a solution process that is inexpensive and suitable for the enlargement of wafer size can be applied to a manufacturing method for transistors. By employing such a solution process, it is possible to manufacture a transistor at a lower temperature than conventional processes. Further, by forming an organic semiconductor layer that uses an organic semiconductor material on a flexible substrate that uses a resin material, it is also possible to manufacture organic transistors having flexibility.

In such a transistor manufacturing method, chemical plating (electroless plating) can be used which is a plating method that utilizes reduction of a material surface according to a contact action. Since electric energy is not used in electroless plating, it is possible to apply plating to a resin material, a glass, and the like as a nonconductor. However, a poor plating material such as a resin material or a glass has weak adhesion to the formed plating film, and the plating easily causes abrasion such as peeling and swelling due to internal stress in the plating film.

Therefore, a method is used in which an etching process is applied to the surface of a substrate by using a chromic acid solution or the like and the surface is chemically roughened. Thereby, the plating film to be formed is formed so as to penetrate into the corrugation of the roughened resin material, and therefore, it is possible to obtain an adhesion force (anchor effect).

In addition, a method (for example, refer to Japanese Unexamined Patent Application, First Publication No. 2008-208389) is disclosed in which a base film that consists of a filler component such as a fine powder silica and a resin composition component is provided on a substrate surface and electroless plating is applied on the base film.

SUMMARY

There may be a case in which a transistor causes a hysteresis in a transfer property. As a main cause for a hysteresis, there is a "carrier trapping" in which an insulation film prevents an electron flow at the interface between a semiconductor and the insulation film. In a transistor design, although a structure or a material is selected such that a hysteresis is not caused, when a transistor is manufactured by a solution process, the degree of freedom in selecting a formation material and a transistor structure is small, and it is difficult to manufacture a transistor that does not easily cause a hysteresis.

An object of an aspect of the present invention is to provide a transistor manufacturing method that is capable of manufacturing a transistor that does not easily cause a hysteresis in a transfer property and has a stable operation behavior. Further, another object of an aspect of the present invention is to provide a transistor having a stable operation behavior.

An aspect of the present invention is a transistor manufacturing method including: forming a first insulator layer of which formation material is a fluorine-containing resin, on a substrate on which a source electrode, a drain electrode, and an organic semiconductor layer that comes into contact with surfaces of the source electrode and the drain electrode are formed so as to cover the organic semiconductor layer; forming a second insulator layer so as to cover the first insulator layer; forming a plating base film on at least part of a surface of the second insulator layer; and after depositing a metal which is an electroless plating catalyst on a surface of the plating base film, forming a gate electrode on the surface of the plating base film by electroless plating, wherein the forming of the plating base film is performed by applying a liquid substance which is a formation material of the plating base film to the surface of the second insulator layer, and the second insulator layer has a higher lyophilic property with respect to the liquid substance than the first insulator layer.

Further, an aspect of the present invention is a transistor including: a substrate on which a source electrode and a drain electrode are formed; a semiconductor layer that comes into contact with surfaces of the source electrode and the drain electrode; a first insulator layer that is provided so as to cover the semiconductor layer; a second insulator layer that is provided so as to cover the first insulator layer; a plating base film that is provided on at least part of a surface of the second insulator layer; and a gate electrode that is provided on a surface of the plating base film, wherein a formation material of the first insulator layer is a fluorine-containing resin, and the second insulator layer has a higher lyophilic property with respect to an organic solvent than the first insulator layer.

According to an aspect of the present invention, it is possible to provide a transistor manufacturing method that is capable of manufacturing a transistor that does not easily cause a hysteresis in a transfer property and has a stable operation behavior. Further, it is possible to provide a transistor having a stable operation behavior.

DESCRIPTION OF THE EMBODIMENTS

Hereinafter, a transistor manufacturing method according to the present embodiment and a transistor according to the present embodiment will be described with reference to FIG. 1 to FIG. 10. Note that, in all the following drawings, the dimensions, ratios, and the like of constituent elements are varied for ease of understanding.

Figure 1:
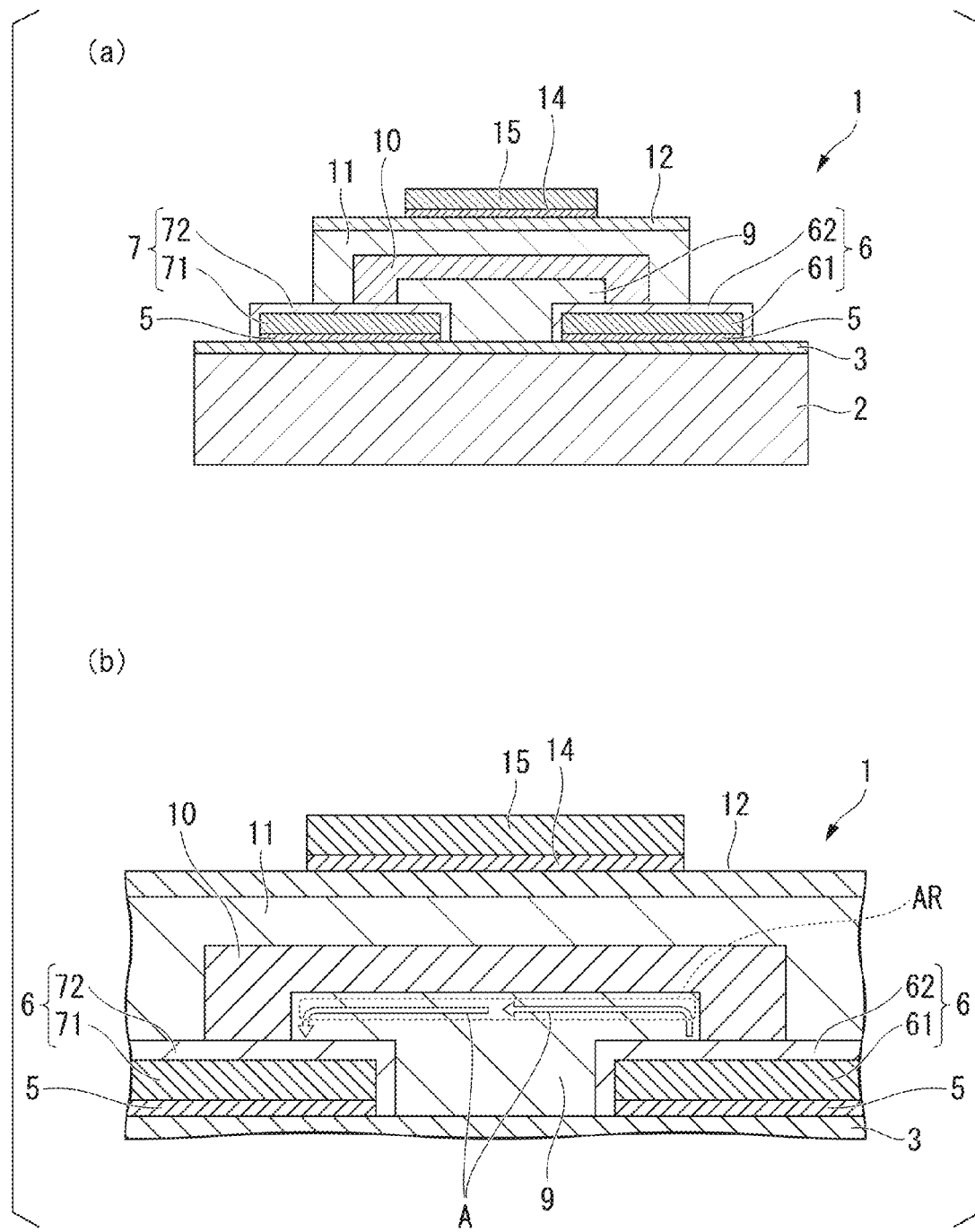
FIG. 1 is a schematic cross-sectional view of a transistor of the present embodiment.

FIG. 1 is an explanation view showing a transistor that is manufactured by a transistor manufacturing method of the present embodiment and a transistor of the present embodiment.

Part (a) of FIG. 1 is a schematic cross-sectional view of a transistor 1. The transistor 1 of the present embodiment is a so-called top-gate and bottom-contact transistor. In the following, an organic transistor that uses an organic semiconductor as a formation material of a semiconductor layer is described; however, the present invention is applicable also to an inorganic transistor that uses an inorganic semiconductor as a formation material of a semiconductor layer.

The transistor 1 includes a a base film (plating base film) 3, a catalyst 5 for electroless plating, a source electrode 6, a drain electrode 7, an organic semiconductor layer (semiconductor layer) 9, a first insulator layer 10, a second insulator layer 11, a base film (plating base film) 12, a catalyst 14 for electroless plating, and a gate electrode 15.

As the substrate 2, any of a substrate having optical transparency and a substrate not having optical transparency can be used. For example, inorganic materials such as glass, quartz glass, and silicon nitride; organic polymers (resins) such as acrylic resins, polycarbonate resins, and polyester resins (for example, polyethylene terephthalate (PET), polybutylene terephthalate (PBT), and the like); and the like can be used for the substrate 2.

The base film 3 is formed so as to cover the entire surface of one main surface of the substrate 2. The base film 3 is a source base film and a drain base film, and the source base film and the drain base film are formed as a continuous film. Further, a catalyst (electroless plating catalyst) 5 is selectively provided on part of a surface of the base film 3. The catalyst 5 is a catalyst for reducing metal ions contained in a plating solution for electroless plating. As the catalyst, metals such as silver, metal palladium, and the like are exemplified. Among the metals, metal palladium is preferably used.

The base film 3 is a film capable of forming a bond to a metal as the catalyst described above, and a silane coupling agent having a group capable of being bonded to the metal is used as a formation material of the base film 3. The base film 3 is formed by applying a liquid substance containing such a silane coupling agent onto the one main surface of the substrate 2.

The "silane coupling agent" as the formational material of the base film 3 is a compound in which a group capable of being bonded to the metal as the catalyst 5 and a group capable of being bonded to the substrate 2 are bonded to a silicon atom. Although the material of the substrate 2 described above does not form a metallic bond together with a metal-made plating film that is formed as a result of electroless plating, by forming such a base film 3, a metal-made plating film can be formed on the surface of the substrate 2 via the base film 3.

Here, the "group capable of being bonded to the metal" refers to a group capable of forming, for example, an ion bond or a coordinate bond with the metal as the catalyst 5 or ions of the metal. As such a group, a group having a nitrogen atom or a sulfur atom is exemplified. Examples of the group having a nitrogen atom may include an amino group, a urea group, and a group obtained by removing one or more hydrogen atoms bonded to a heterocyclic compound containing a nitrogen atom. Further, examples of the group having a sulfur atom may include a thiol group (or a mercapto group), a thiocarbonyl group, a thiourea group, and a group obtained by removing one or more hydrogen atoms bonded to a heterocyclic compound containing a sulfur atom. Examples of the heterocyclic compound containing a nitrogen atom or a sulfur atom include: monocyclic aromatic heterocyclic compounds such as pyrrole, imidazole, pyridine, pyrimidine, and thiophene; polycyclic aromatic heterocyclic compounds such as indole and benzothiophene; and non-aromatic heterocyclic compounds in which two or more carbon atoms in an aromatic ring of each of these aromatic compounds are hydrogenated.

Further, as the "group capable of being bonded to the substrate 2", a hydroxyl group and an alkoxy group of 1 to 6 carbon atoms are exemplified.

Specific examples of the compound that can be used as the formation material of such a base film 3 may include N-cyclohexyl-aminopropyltrimethoxysilane, bis(3-(trimethoxysilyl)propyl)ethylenediamine, 1-(3-(trimethoxysilylpropyl))urea, bis(3-trimethoxysilylpropyl))urea, 2,2-dimethoxy-1,6-diaza-2-silacyclooctane, N-(3-(trimethoxysilylpropyl))-4,5-dihydroimidazole, bis(3-(trimethoxysilyl)propyl)thiourea, 3-trimethoxysilylpropanethiol, and polyethyleneimine modified with a trimethoxysilylpropyl group.

Among these, as the silane coupling agent, a silane coupling agent having an amino group is preferable, and a silane coupling agent which is a primary amine having a group represented by $-NH_2$ or a secondary amine having a group represented by $-NH-$ is more preferable. In the following description, as the base film 3, a base film formed by using a silane coupling agent as a primary amine will be described.

Note that, although it is shown in the drawing that the base film 3 is formed on the entire upper surface of the substrate 2, the base film 3 may be selectively formed on only a location where the catalyst 5 is provided. In this case, a silane coupling agent as a formation material of the base film 3 is selectively applied on the upper surface of the substrate 2 by using a generally known method, and thereby it is possible to selectively form the base film 3. Further, in the upper surface of the substrate 2, first, the silane coupling agent may be applied on a region that is larger than the region in which the base film 3 is formed, and then a film formed at a portion that protrudes from the region in which the base film 3 is formed may be irradiated with ultraviolet light to thereby decompose and remove the silane coupling agent to selectively form the base film 3.

The source electrode 6 and the drain electrode 7 are metal electrodes formed on the surface of the catalyst 5. The source electrode 6 and the drain electrode 7 are formed so as to be separated from each other at a distance corresponding to a channel length. The source electrode 6 has a first electrode 61 and a second electrode 62 that covers the surface of the first electrode 61. Similarly, the drain electrode 7 has a third electrode 71 and a fourth electrode 72 that covers the surface of the third electrode 71.

The first electrode 61 and the third electrode 71 are formed of a metal that is deposited on the surface of the catalyst 5 by electroless plating. As the material of the first electrode 61 and the third electrode 71, nickel phosphorus (NiP) or copper (Cu) is exemplified. The first electrode 61 and the third electrode 71 may each be formed by the same material or may each be formed by a different material. In the present embodiment, it is described that nickel phosphorus (work function: 5.5 eV) is used as the formation material of the first electrode 61 and the third electrode 71.

The second electrode 62 is a metal plating layer that is formed so as to cover the entire surface of the first electrode 61 that does not come into contact with the catalyst 5 of the first electrode 61. That is, the second electrode 62 is provided so as to cover an upper surface of the first electrode 61 and lateral surfaces (opposing surfaces) of the first electrode 61 that oppose to each other. The fourth electrode 72 is a metal plating layer that is formed so as to cover the entire surface of the third electrode 71 that does not come into contact with the catalyst 5 of the third electrode 71. That is, the fourth electrode 72 is provided so as to cover an upper surface of the third electrode 71 and lateral surfaces (opposing surfaces) of the third electrode 71 that oppose to each other. The first electrode 61 is covered by the second electrode 62 to thereby suppress the temporal corrosion of the first electrode 61, the third electrode 71 is covered by the fourth electrode 72 to thereby suppress the temporal corrosion of the third electrode 71, and the performance of the transistor 1 can be stably maintained.

As the formation material of the second electrode 62 and the fourth electrode 72, a metal material having a work function in which electron transfer (or hole transfer) is easy in relation to the HOMO/LUMO level of the formation material of a semiconductor layer 9 to be described later is used. The second electrode 62 and the fourth electrode 72 may each be formed by the same material or may each be formed by a different material. The present embodiment is described using an example in which gold (work function: 5.4 eV) is used as the formation material of the second electrode 62 and the fourth electrode 72.

The semiconductor layer 9 is provided on the surface of the base film 3 between the source electrode 6 and the drain electrode 7 and is formed in contact with the source electrode 6 and the drain electrode 7. Specifically, the semiconductor layer 9 is provided in contact with the lateral surfaces that oppose to each other of the source electrode 6 and the drain electrode 7.

Further, the semiconductor layer 9 is provided so as to cover part of the upper surfaces of the source electrode 6 and the drain electrode 7. The semiconductor layer 9 comes into contact with the second electrode 62 and the fourth electrode 72.

As the formation material of the semiconductor layer 9, generally known organic semiconductor materials can be used.

For example, it is possible to use: p-type semiconductors such as copper phthalocyanine (CuPc), pentacene, rubrene, tetracene, and P3HT (poly(3-hexylthiophene-2,5-diyl)); and n-type semiconductors such as fullerenes such as $C_{60}$ and perylene derivatives such as PTCDI-C8H (N,N'-dioctyl-3, 4,9,10-perylene tetracarboxylic diimide). Among these, soluble pentacene such as TIPS pentacene (6,13-Bis(triisopropylsilylethynyl) pentacene) or an organic semiconductor polymer such as P3HT (poly(3-hexylthiophene-2,5-diyl)) is soluble in an organic solvent such as toluene, can be used in forming the semiconductor layer 9 by a wet process, and therefore, is preferable. The present embodiment is described using an example in which TIPS pentacene (HOMO level: 5.2 eV) which is a p-type semiconductor is used as the formation material of the semiconductor layer 9.

Further, the formation material of the semiconductor layer 9 is not limited to organic semiconductor materials; and generally known inorganic semiconductor materials can also be used as the formation material of the semiconductor layer 9.

As described above, the work function of nickel phosphorus as the formation material of the first electrode 61 and the third electrode 71 is 5.5 eV, the work function of gold as the formation material of the second electrode 62 and the fourth electrode 72 is 5.4 eV, and the HOMO level of TIPS pentacene as the formation material of the semiconductor layer 9 is 5.2 eV. That is, at the surface of the source electrode 6, the second electrode 62 is formed using a metal material having a work function (energy level difference with HOMO of the semiconductor layer 9 is small) at which electron transfer is easier between the second electrode 62 and the formation material of the semiconductor layer 9 compared to between the first electrode 61 and the formation material of the semiconductor layer 9. At the surface of the drain electrode 7, the fourth electrode 72 is formed using a metal material having a work function (energy level difference with HOMO of the semiconductor layer 9 is small) at which electron transfer is easier between the fourth electrode 72 and the formation material of the semiconductor layer 9 compared to between the third electrode 71 and the formation material of the semiconductor layer 9. Therefore, it is possible to reduce a Schottky resistance between the semiconductor layer 9 and the source electrode 6 and a Schottky resistance between the semiconductor layer 9 and the drain electrode 7, and electrons can be well transferred at the time of driving.

The first insulator layer 10 is provided so as to cover a surface of the semiconductor layer 9. Specifically, the first insulator layer 10 covers an upper surface and a lateral surface of the semiconductor layer 9 and is provided so as to come into contact with the source electrode 6 and the drain electrode 7. The entire periphery of the semiconductor layer 9 is covered by the first insulator layer 10, the source electrode 6, the drain electrode 7, and the base film 3.

The formation material of the first insulator layer 10 is a resin material that has insulation properties, is capable of electrically insulating the gate electrode 15 from the source electrode 6 and the drain electrode 7, and including no polar group. The formation material of the first insulator layer 10 can be a fluorine-containing resin. Further, it is preferable to use an amorphous material as the fluorine-containing resin since high optical transparency can be provided for light in a visible range. Examples of such a fluorine-containing resin include a cyclized polymer of perfluoro (butenyl vinyl ether). As the formation material of the first insulator layer 10, for example, CYTOP (manufactured by Asahi Glass Co., Ltd.), EGC (manufactured by 3M Company), and the like can be used. In the following, an example is described in which the first insulator layer 10 is formed by using a fluorine-containing resin having optical transparency.

The second insulator layer 11 is provided so as to cover a surface of the first insulator layer 10. Specifically, the second insulator layer 11 covers an upper surface and a lateral surface of the first insulator layer 10 and is provided so as to come into contact with the source electrode 6 and the drain electrode 7.

The formation material of the second insulator layer 11 is a curable resin material that has insulation properties and that is capable of electrically insulating the gate electrode 15 from the source electrode 6 and the drain electrode 7.

Among curable resin materials, a photo-curable resin material can be the formation material since manufacturing or microfabrication is easy. For example, examples of the formation material of the second insulator layer 11 include an ultraviolet curable acrylic resin, epoxy resin, ene-thiol resin, and silicone resin. In the following, an example is described in which the second insulator layer 11 is formed by using an ultraviolet curable epoxy resin.

A numerical value that is capable of preventing short circuit between the source electrode 6 and the gate electrode 15 and between the drain electrode 7 and the gate electrode 15 is set as the total thickness of the first insulator layer 10 and the second insulator layer 11. For example, when the total thickness of the first insulator layer 10 and the second insulator layer 11 is about several hundreds of nanometers, a leak current can be prevented.

The base film 12 is formed on the entire upper surface of the second insulator layer 11. The base film 12 is used so as to form the gate electrode 15. A catalyst (electroless plating catalyst) 14 is selectively provided on part of a surface of the base film 12. The formation material of the catalyst 14 can be the same as that of the catalyst 5 described above.

The formation material of the base film 12 can be the same as that of the base film 3 described above; however, the formation materials of the base film 3 and the base film 12 may be different from each other. In the following, an example is described in which the base film 12 is formed by using a silane coupling agent as a primary amine that is the same as the base film 3.

Note that, in the drawings, the base film 12 is formed on the entire upper surface of the second insulator layer 11; however, the base film 12 may be formed selectively only at a position where the catalyst 14 is provided.

The gate electrode 15 is a metal electrode that is formed on the surface of the catalyst 14 over the base film 12. The gate electrode 15 is formed of a metal that is deposited on the surface of the catalyst 14 by electroless plating as described later. As the material of the gate electrode 15, nickel phosphorus (NiP) or copper (Cu) is exemplified.

The transistor 1 of the present embodiment has a configuration as described above.

Part (b) of FIG. 1 is a partial enlarged view for describing effects of the transistor 1.

In the transistor 1 of the present embodiment, a channel region AR of the semiconductor layer 9 is formed near the first insulator layer 10. Here, when a resin material that includes a polar group such as a carbonyl group, an amino group, and a hydroxyl group is used as the formation material of the first insulator layer 10, a phenomenon called as a "carrier trapping" easily occurs in which the polar group attracts electrons that flow through the channel region AR as indicated by an arrow A to prevent the flow of the electrons. When the carrier trapping occurs, the behavior of the transistor is not stable, and, for example, a problem is caused in which a hysteresis is caused in device properties.

On the other hand, in the transistor 1 of the present embodiment, a fluorine-containing resin that is a resin material which does not include a polar group is a formation material of the first insulator layer 10 that comes into contact with the semiconductor layer 9.

Therefore, the carrier trapping described above does not easily occur, and the transistor can be a high-quality transistor having a stable behavior.

Further, in the transistor 1, the source electrode 6, the drain electrode 7, and the gate electrode 15, which are formed by electroless plating, are formed on the base films 3 and 12 (gate base film, source base film, and drain base film), which are formed by using a silane coupling agent as a formation material. For example, when these electrodes are formed in a region having an uneven shape, an uneven shape is imparted to each of these electrodes in response to the unevenness of a base. Then, the distance between the electrodes laminated so as to interpose the insulator layer is not constant, and there is a possibility that the insulation is damaged and a leak current is generated at the position where the gate electrode and the source electrode are close in distance to each other or the gate electrode and the drain electrode are close in distance to each other. Further, if the base has an uneven shape, there is a possibility that an uneven shape is imparted also to the channel region AR of the semiconductor layer that planarly overlaps the gate electrode, and the migration distance of carriers in the channel region becomes longer to deteriorate the performance of the transistor 1.

However, in the transistor 1 of the present embodiment, since the base films 3 and 12 are formed by using a silane coupling agent as a formation material, and the surface of the substrate is not roughened or a base film containing a filler component is not used, these base films become smooth films. Therefore, an uneven shape is not formed by forming the base films 3 and 12, and a problem caused by the uneven shape does not occur. Therefore, the transistor 1 becomes a high-performance transistor.

Hereinafter, the manufacturing method of the above transistor 1 will be described with reference to FIGS. 2 to 10.

Figure 2:
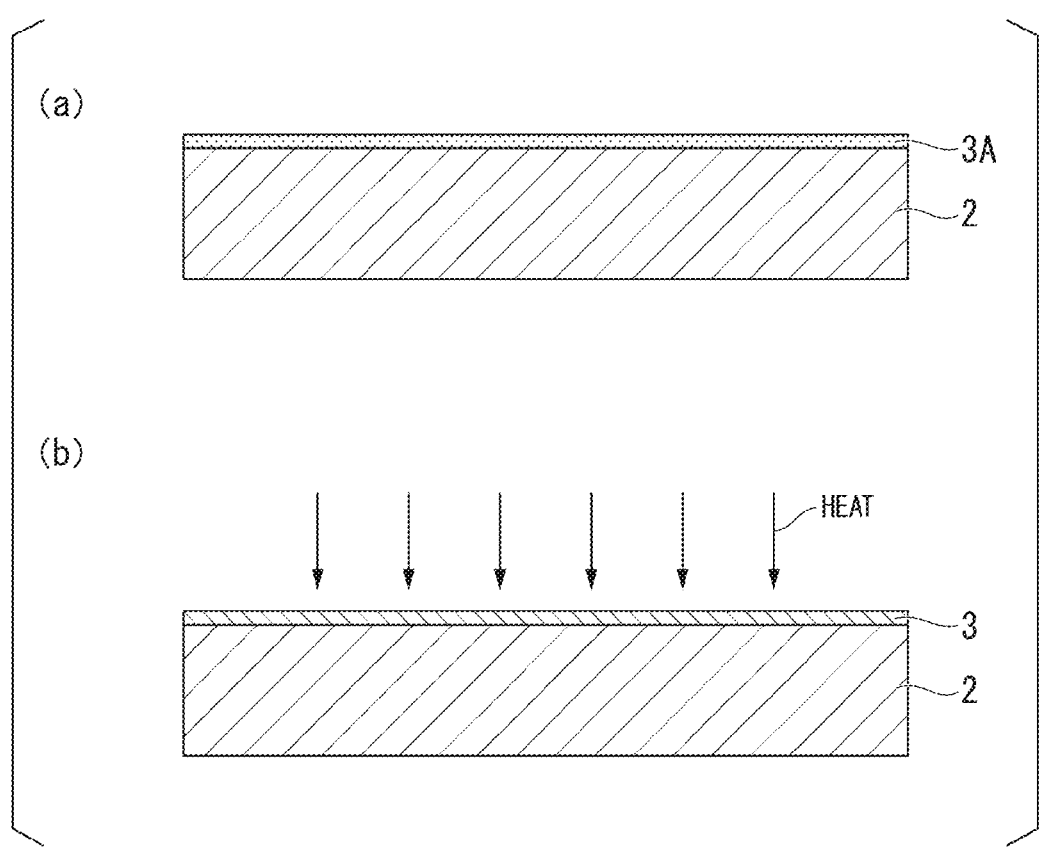
FIG. 2 is a process view showing a transistor manufacturing method of the present embodiment.

First, as shown in part (a) of FIG. 2, a liquid substance that is obtained, if necessary, by diluting the above-mentioned silane coupling agent with an organic solvent is applied onto the surface of a substrate 2 to form a coating film 3A. As the method of applying the liquid substance, generally known methods such as spin coating, dip coating, spray coating, roll coating, brushing, flexographic printing, and screen printing can be exemplified.

Here, an example is described in which 3-aminopropyl-triethoxysilane which is a primary amine is used as the silane coupling agent.

As the organic solvent, various organic solvents can be used as long as the solvents are capable of dissolving the silane coupling agent. Among these organic solvents, a polar solvent can be preferably used. Examples of the solvent that can be used include: alcohols such as methanol, ethanol, 1-propanol, and 2-propanol (isopropyl alcohol (IPA)); ethers such as propylene glycol monomethyl ether acetate (PG-MEA); aromatic hydrocarbons such as toluene; nitriles such as acetonitrile; esters such as acetic acid ester; and ketones such as acetone, methyl ethyl ketone, and methyl isobutyl ketone.

Next, as shown in part (b) of FIG. 2, the organic solvent is volatilized and removed by a heat treatment to form a base film 3. The base film 3 formed in such a manner is a silane coupling agent layer having an extremely thin film thickness, and therefore is a transparent film in which light scattering does not easily occur. Therefore, for example, when the transistor manufactured by the manufacturing method of the present embodiment is provided on a substrate having optical transparency, it is possible to maintain the optical transparency as a combination of the substrate 2 and the base film 3 even when the base film 3 is formed on the entire surface of the substrate 2, and it is possible to easily form the film.

Figure 3:
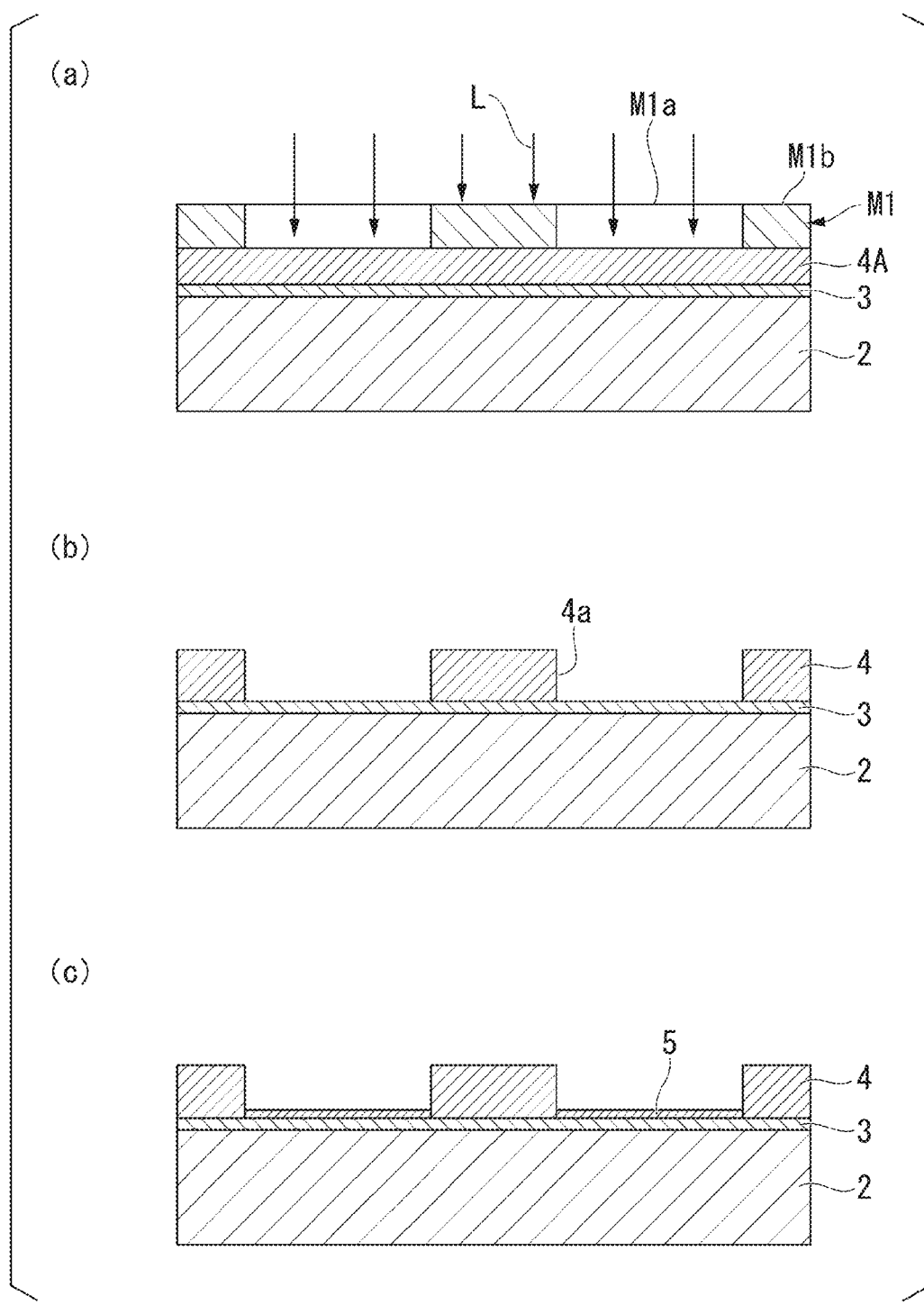
FIG. 3 is a process view showing the transistor manufacturing method of the present embodiment.

Next, as shown in part (a) of FIG. 3, a resist material is applied onto the base film 3 and is then prebaked to thereby form a resist layer 4A that is not patterned. Here, as the resist material, a positive photoresist is used.

Then, the resist layer 4A is irradiated with ultraviolet light L through a mask M1 that includes an opening part M1*a* provided at a position corresponding to a region where a metal electrode is formed and that includes a light shielding part M1*b* provided at a region where the metal electrode is not formed, and the resist layer 4A is exposed.

Next, as shown in part (b) of FIG. 3, the resist layer irradiated with ultraviolet light is developed by a developer that dissolves the resist layer to thereby form a resist layer 4 including an opening part 4*a*.

Next, as shown in part (c) of FIG. 3, a catalyst 5 used in electroless plating is deposited on the surface of the base film 3 exposed through the opening part 4*a* formed in the resist layer 4. Specifically, by causing a colloidal solution of a divalent palladium salt to come into contact with the base film 3, a metal which is the catalyst 5 is deposited on the base film 3.

A general electroless plating process of a resin includes washing, etching, catalyst imparting, and electroless plating in this order. Here, "catalyst imparting" is a process of attaching a metal such as palladium (Pd) that is an electroless plating reaction initiator (catalyst), to the surface of a region where plating is applied. Generally, "catalyst imparting" includes a process in which a colloidal solution of a divalent palladium salt and a divalent tin (Sn) salt is caused to come into contact with a substrate to be attached by palladium, then the substrate is immersed into an acid or alkali solution that is called an accelerator, and thereby, the divalent palladium is reduced to zero-valent palladium to be activated.

On the other hand, as described in the present embodiment, it was confirmed by the inventors that, when the silane coupling agent which is a formation material of a base film is a primary amine or a secondary amine, the reduction treatment using the above-mentioned accelerator is not required (described later). Therefore, when a primary amine or a secondary amine is used as the silane coupling agent, the operation of electroless plating is simplified.

In the present embodiment, since 3-aminopropyltriethoxysilane which is a primary amine is used as the formation material of the base film 3, a reduction treatment is not required, and the operation is simplified.

Note that, when the silane coupling agent is a tertiary amine or a silicon compound having another "group capable of being bonded to a metal", a colloidal solution of a divalent palladium salt is applied, and then a normal treatment (activating process) that uses the above-mentioned accelerator is performed, and thereby, it is possible to capture the catalyst 5 for electroless plating on the base film 3.

Figure 4:
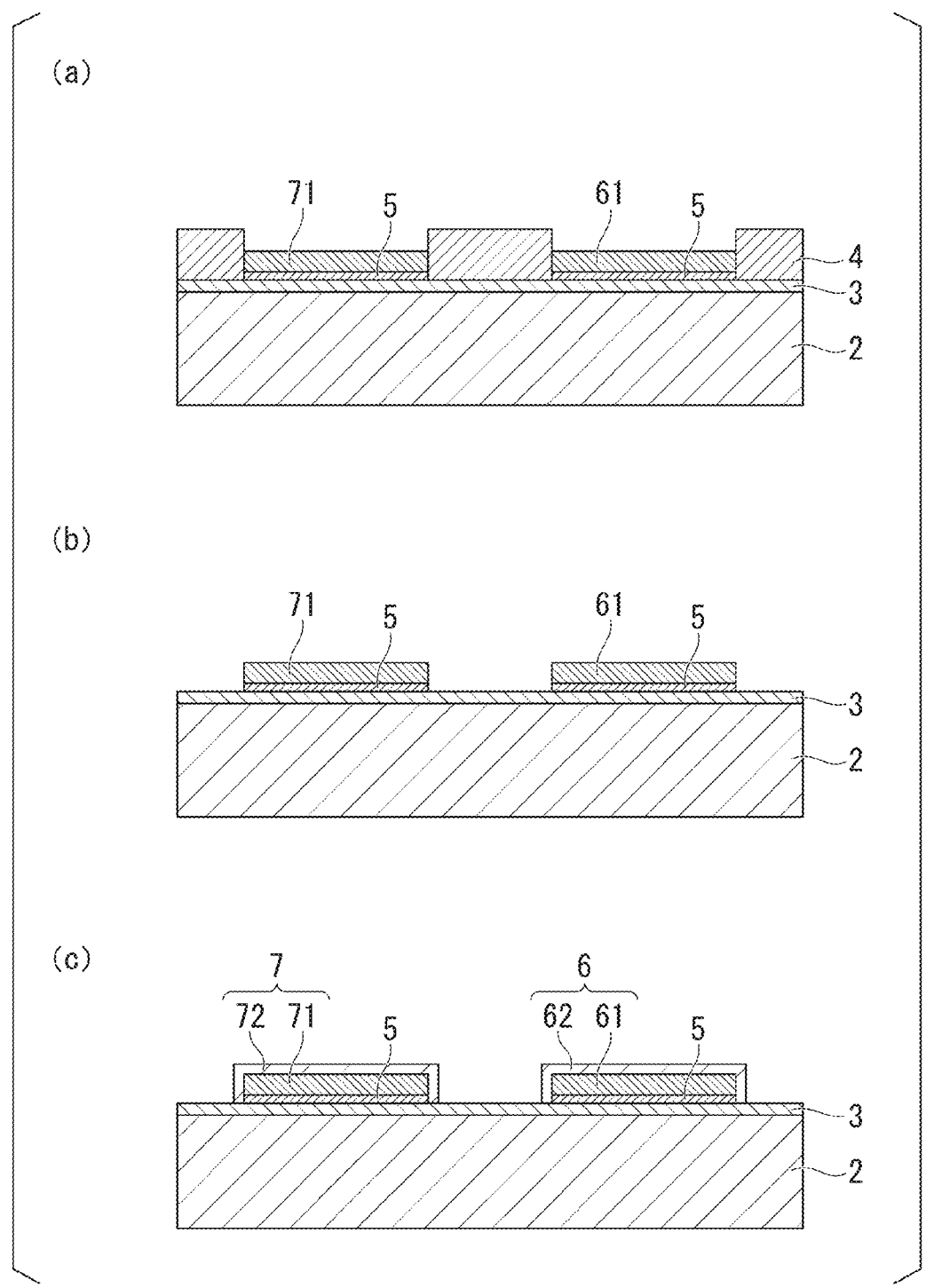
FIG. 4 is a process view showing the transistor manufacturing method of the present embodiment.

Next, as shown in part (a) of FIG. 4, an electroless plating solution is caused to come into contact with the catalyst 5. Thereby, metal ions dissolved in the electroless plating solution is reduced and deposited on the surface of the catalyst 5, and the first electrode 61 and the third electrode 71 that include nickel phosphorus as a formation material is selectively formed in the opening part 4*a*.

When the silane coupling agent is a primary amine or a secondary amine, the catalyst 5 is immersed in the electroless plating solution without performing the activation using the accelerator, and thereby the surface of the catalyst 5 is plated. Therefore, it can be indirectly confirmed that metal palladium is captured on the surface of the base film 3.

Next, as shown in part (b) of FIG. 4, the entire surface of the remaining resist layer is exposed with ultraviolet light, and then the resist layer is removed by a generally known developer. In this way, the first electrode 61 and the third electrode 71 are formed.

Next, as shown in part (c) of FIG. 4, the entire body is immersed into a gold plating bath for substitution to thereby allow the surfaces of the first electrode 61 and the third electrode 71 to be substituted and deposited with gold. Further, by the immersion in a gold plating bath for reduction, a second electrode 62 formed of gold as a formation material is formed on the surface of the first electrode 61, and a fourth electrode 72 formed of gold as a formation material is formed on the surface of the third electrode 71. In this way, a source electrode 6 and a drain electrode 7 are formed.

Figure 5:
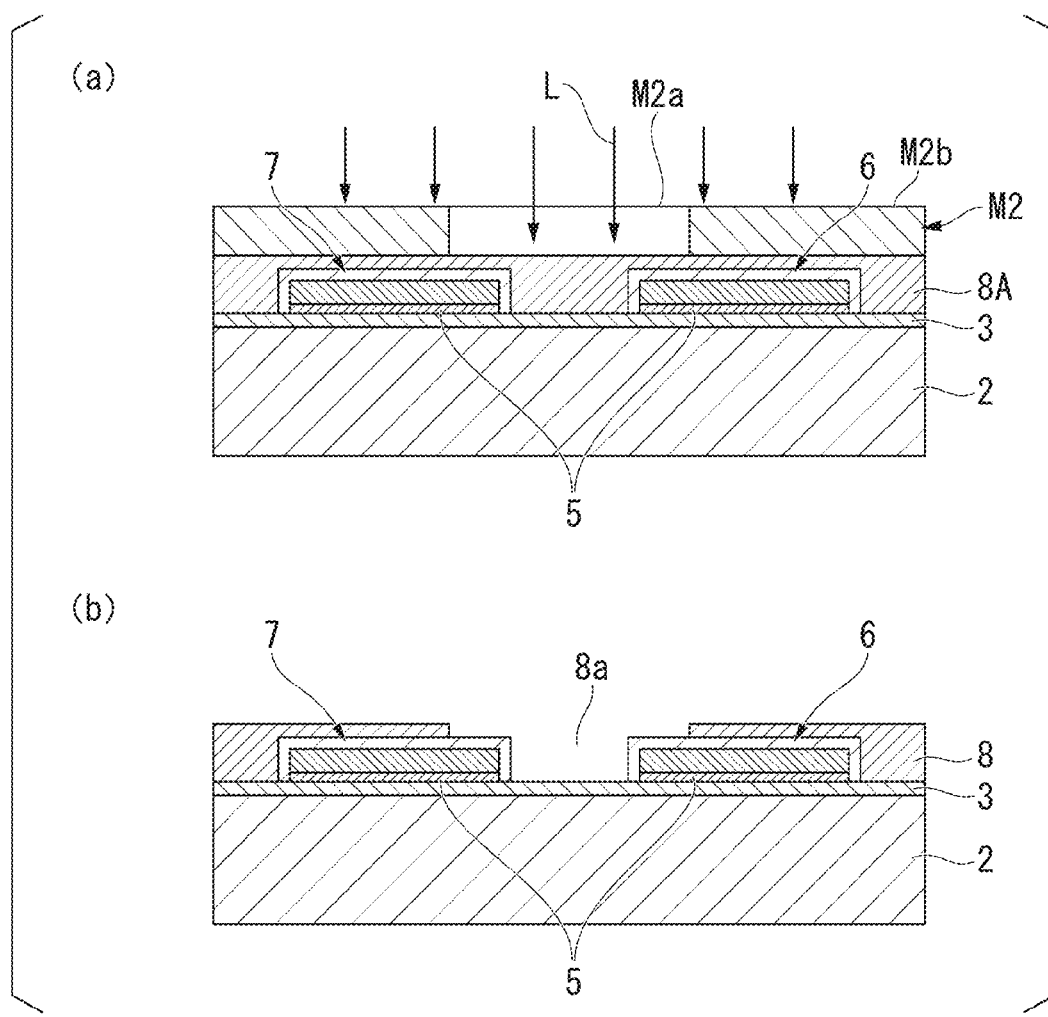
FIG. 5 is a process view showing the transistor manufacturing method of the present embodiment.

Next, as shown in part (a) of FIG. 5, a resist material is applied on the base film 3, the source electrode 6, and the drain electrode 7 and is then prebaked to thereby form a resist layer 8A that is not patterned. Here, as the resist material, a positive photoresist is used.

Then, the resist layer 8A is irradiated with ultraviolet light L through a mask M2 that includes an opening part M2*a* provided at a position corresponding to a region where a semiconductor layer is formed and that includes a light shielding part M2*b* provided at a region where the semiconductor layer is not formed, and the resist layer 8A is exposed.

Next, as shown in part (b) of FIG. 5, the resist layer irradiated with ultraviolet light is developed by a developer that dissolves the resist layer to thereby form a resist layer 8 including an opening part 8*a*. Part of the source electrode 6, part of the drain electrode 7, and the base film 3 between the source electrode 6 and the drain electrode 7 are exposed through the opening part 8*a*.

Figure 6:
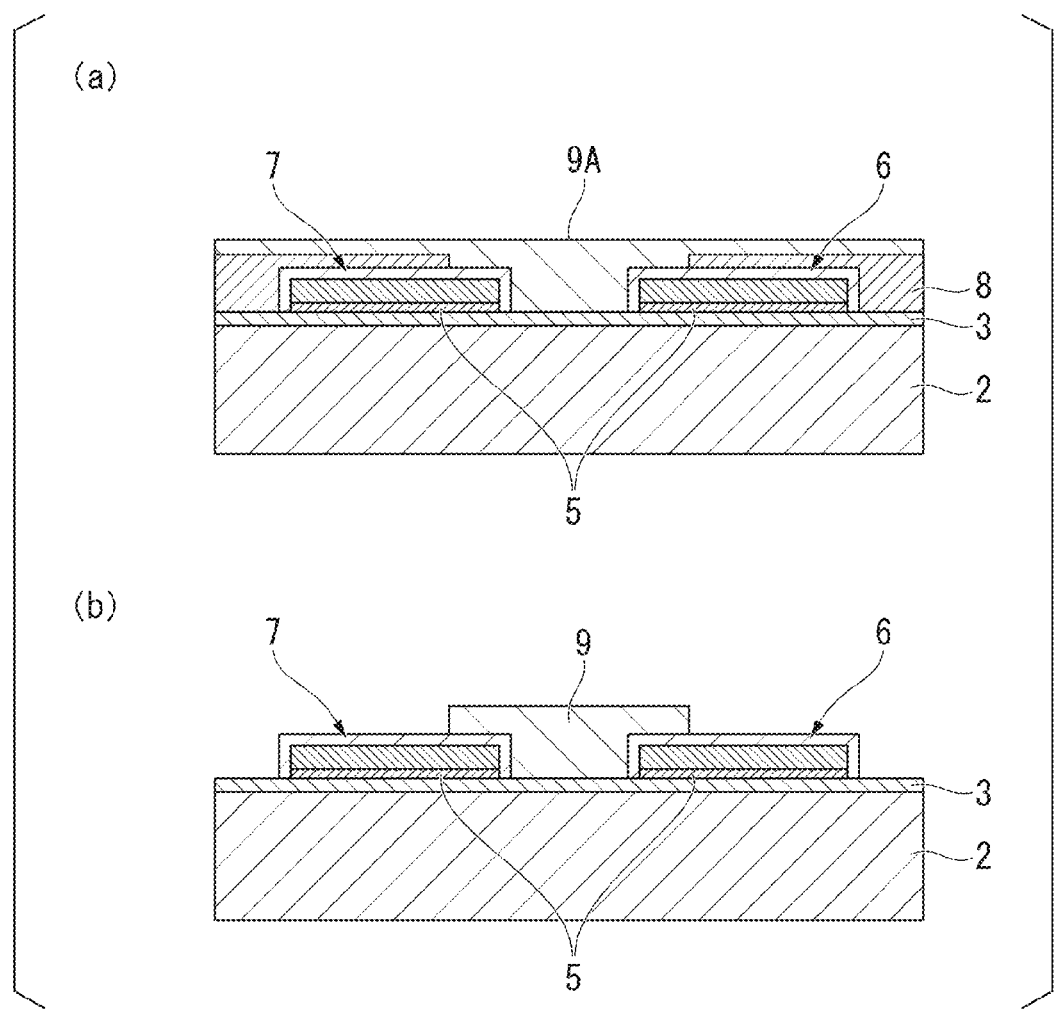
FIG. 6 is a process view showing the transistor manufacturing method of the present embodiment.

Next, as shown in part (a) of FIG. 6, a solution in which an organic semiconductor polymer such as P3HT and a pentacene soluble in an organic solvent like TIPS pentacene is dissolved in the organic solvent such as toluene, is applied in the opening part 8*a* and on the upper surface of the resist layer 8, between the source electrode 6 and the drain electrode 7 so as to cover the opening part 8*a*. Then, the solvent is vaporized by heating, and the sample is dried to thereby form a layer 9A of a semiconductor material.

Next, as shown in part (b) of FIG. 6, the entire surface of the resist layer 8 is irradiated with ultraviolet light to be exposed, and then the resist layer is removed by a developer. Thereby, the redundant semiconductor material on the resist layer 8 is removed in addition to removal of the resist layer 8, and the semiconductor layer 9 is formed.

Note that, here, the semiconductor layer 9 is formed by a wet method; however, a method such as a sublimation method, a transfer method, or the like can also be used.

Figure 7:
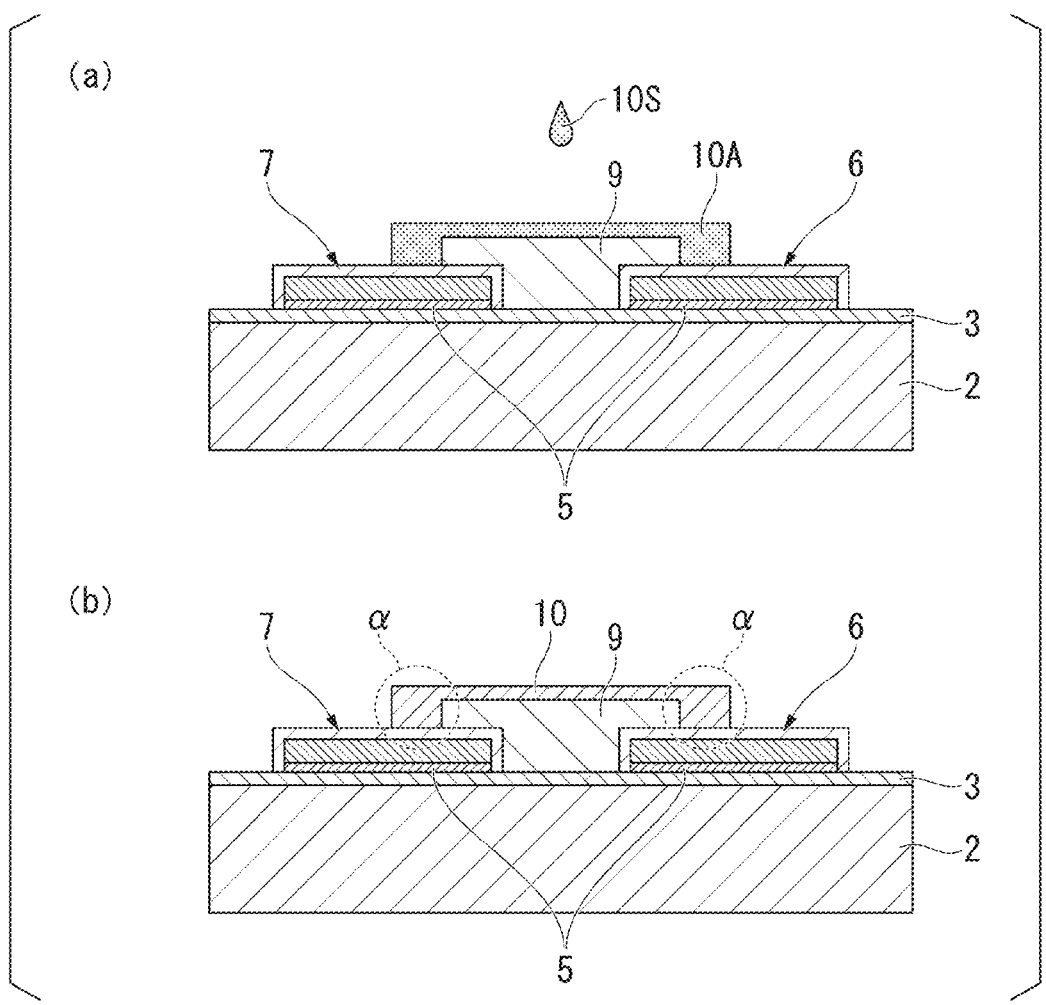
FIG. 7 is a process view showing the transistor manufacturing method of the present embodiment.

Next, as shown in part (a) of FIG. 7, a solution 10S obtained by dissolving a monomer or oligomer of a fluorine-containing resin in a fluorine-containing solvent is applied on the semiconductor layer 9 to form a coating film 10A of the monomer or oligomer. The solution 10S may be applied by such an amount that the coating film 10A to be formed can sufficiently cover the upper surface and the lateral surface of the semiconductor layer 9.

Examples of the monomer of the fluorine-containing resin can include perfluoro (butenyl vinyl ether).

Examples of the fluorine-containing solvent can include a perfluoro solvent such as deca-fluoromethoxy-trifluoromethyl-pentane and perfluorotributylamine.

Since the fluorine-containing solvent that is used as the solvent of the solution 10S does not easily dissolve the organic semiconductor material as the formation material of the semiconductor layer 9, the semiconductor layer 9 is not eluted when the solution 10S is applied, and it is possible to prevent the semiconductor layer 9 from being degraded.

Next, as shown in part (b) of FIG. 7, the solvent is removed from the coating film 10A by heating, and thereby the monomer or oligomer included in the coating film 10A is polymerized to form a first insulator layer 10 formed by a fluorine-containing resin as a formation material. At this time, as indicated by a reference numeral a in the drawing, since the first insulator layer 10 covers not only the upper surface but also the lateral surface of the semiconductor layer 9, the first insulator layer 10 functions as a protection film of the semiconductor layer 9, and it is possible to prevent the semiconductor layer 9 from being contaminated or degraded in the latter process.

Figure 8:
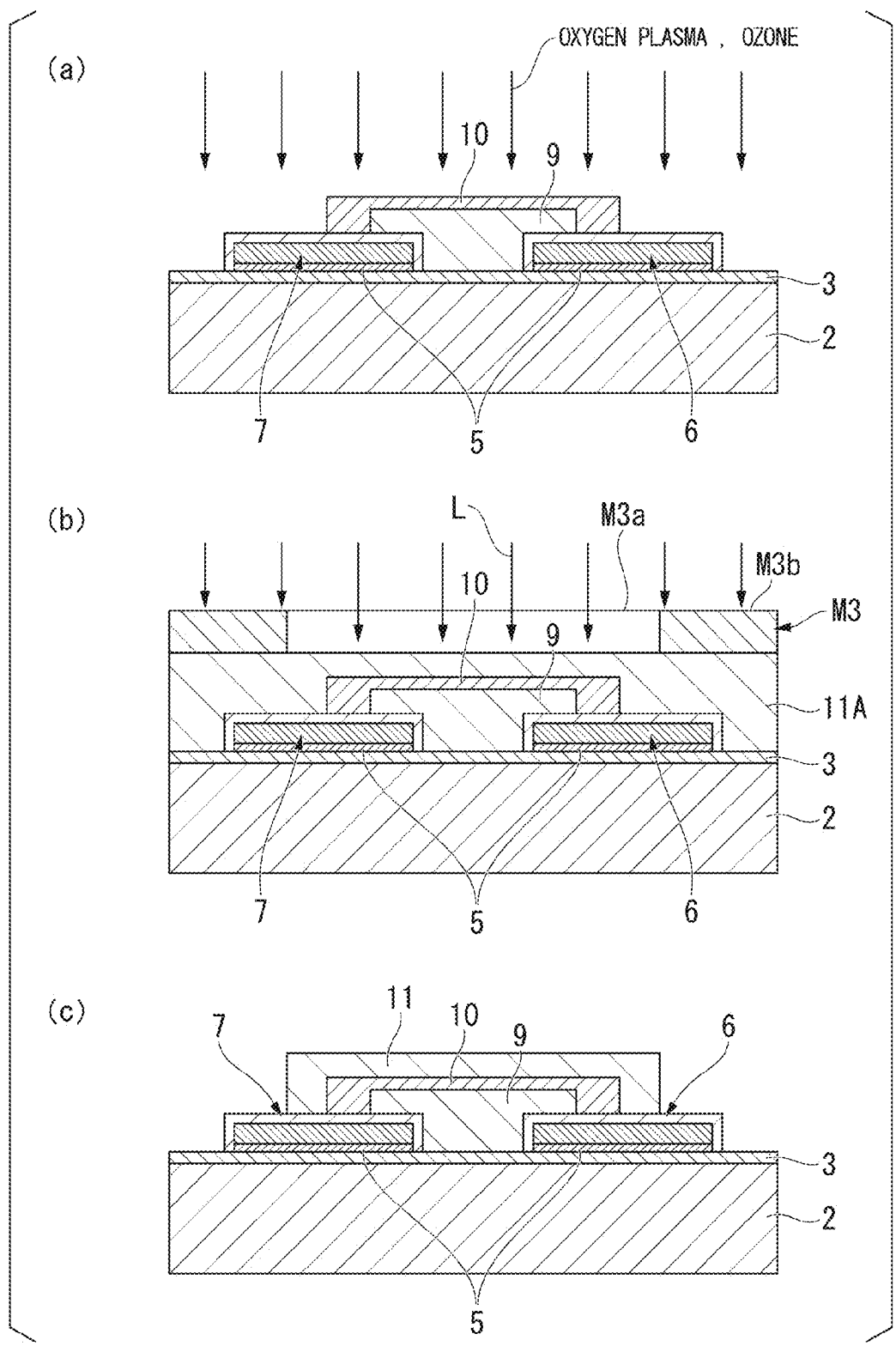
FIG. 8 is a process view showing the transistor manufacturing method of the present embodiment.

Next, as shown in part (a) of FIG. 8, an atmospheric pressure oxygen plasma treatment or an ultraviolet-ozone cleaning treatment is applied to the surface of the first insulator layer 10. Thereby, the surface of the first insulator layer 10 is cleaned, and a hydroxyl group is formed on the surface of the first insulator layer 10 to improve the polarity of the surface of the first insulator layer 10.

Next, as shown in part (b) of FIG. 8, a solution that includes a monomer of an ultraviolet curable epoxy resin as the formation material of a second insulator layer 11 is applied on the entire upper surface of the substrate 2 so as to cover the first insulator layer 10, the source electrode 6, and the drain electrode 7, and a coating film 11A is formed. Then, the coating film 11A is irradiated with ultraviolet light L through a mask M3 that includes an opening part M3a provided at a position corresponding to a region where the second insulator layer is formed and that includes a light shielding part M3b provided at a region where the second insulator layer is not formed, and the coating film 11A is exposed. At this time, a thermal process may be added in order to accelerate a curing reaction by the ultraviolet light irradiation.

Next, as shown in part (c) of FIG. 8, by a development with a developer that dissolves the monomer of the ultraviolet curable epoxy resin, the second insulator layer 11 is formed.

The total film thickness of the first insulator layer 10 and the second insulator layer 11 can be appropriately changed by controlling the concentration of the solution that includes the formation material of each layer and a coating condition. In the above-mentioned process in which the first insulator layer 10 and the second insulator layer 11 are formed, the solution as the formation material is thickly applied such that the total film thickness of the first insulator layer 10 and the second insulator layer 11 is about several hundreds of nanometers in order to prevent a leakage between the source electrode 6 and the gate electrode formed above and a leakage between the drain electrode 7 and the gate electrode formed above.

Figure 9:
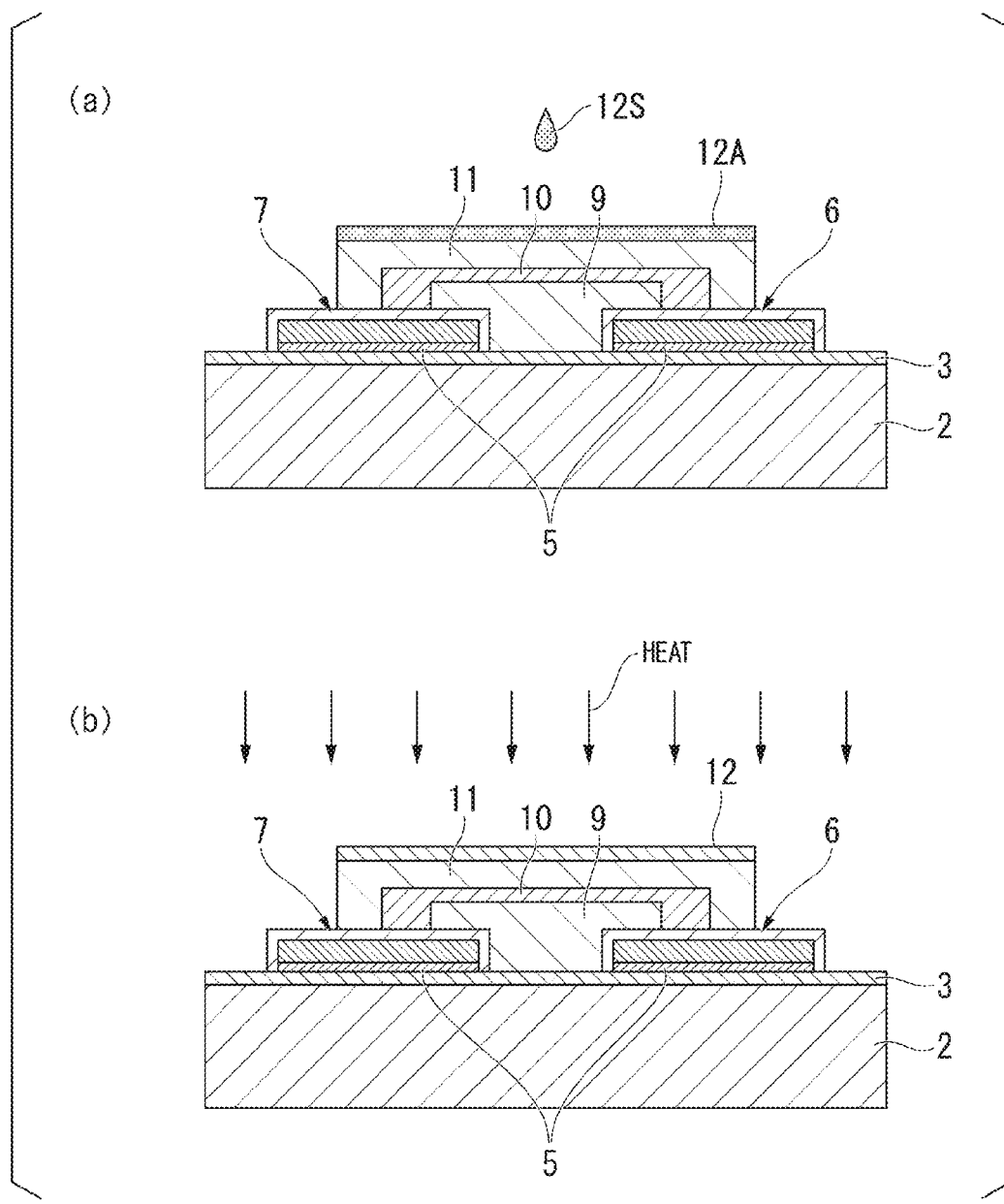
FIG. 9 is a process view showing the transistor manufacturing method of the present embodiment.

Next, as shown in part (a) of FIG. 9, a liquid substance 12S that is obtained, if necessary, by diluting the above-mentioned silane coupling agent with an organic solvent is applied onto the entire upper surface of the second insulator layer 11 to form a coating film 12A.

As the silane coupling agent and the organic solvent, the same material presented as an example in forming the base film 3 described above can be used.

At this time, the surface on which the liquid substance is applied is not the first insulator layer 10 formed by a fluorine-containing resin as the formation material but the second insulator layer 11 formed by a ultraviolet curable epoxy resin as the formation material. Since the formation material of the second insulator layer 11 has a higher lyophilic property with respect to the liquid substance than the formation material of the first insulator layer 10, the applied liquid substance is favorably spread, and the coating film 12A can be well formed compared to a case where the liquid substance is directly applied on the first insulator layer 10.

Note that, when the formation material of the second insulator layer 11 is selected, it is possible to determine whether "the formation material of the second insulator layer 11 has a higher lyophilic property with respect to the liquid substance than the formation material of the first insulator layer 10", for example, by measuring a contact angle using the liquid substance. Specifically, it is possible to determine a relative lyophilic property by preparing a test piece having a surface formed of the same formation material as that of the first insulator layer 10 and a test piece having a surface formed of the same formation material as that of the second insulator layer 11 and comparing a magnitude relationship between the contact angles of the test pieces with the liquid substance. Note that, it is considered that the lyophilic property is high when the contact angle is small, and the lyophilic property is low when the contact angle is large.

Next, as shown in part (b) of FIG. 9, a heat treatment is applied to the coating film 12A, and the organic solvent is volatilized and removed to thereby form a base film 12.

Figure 10:
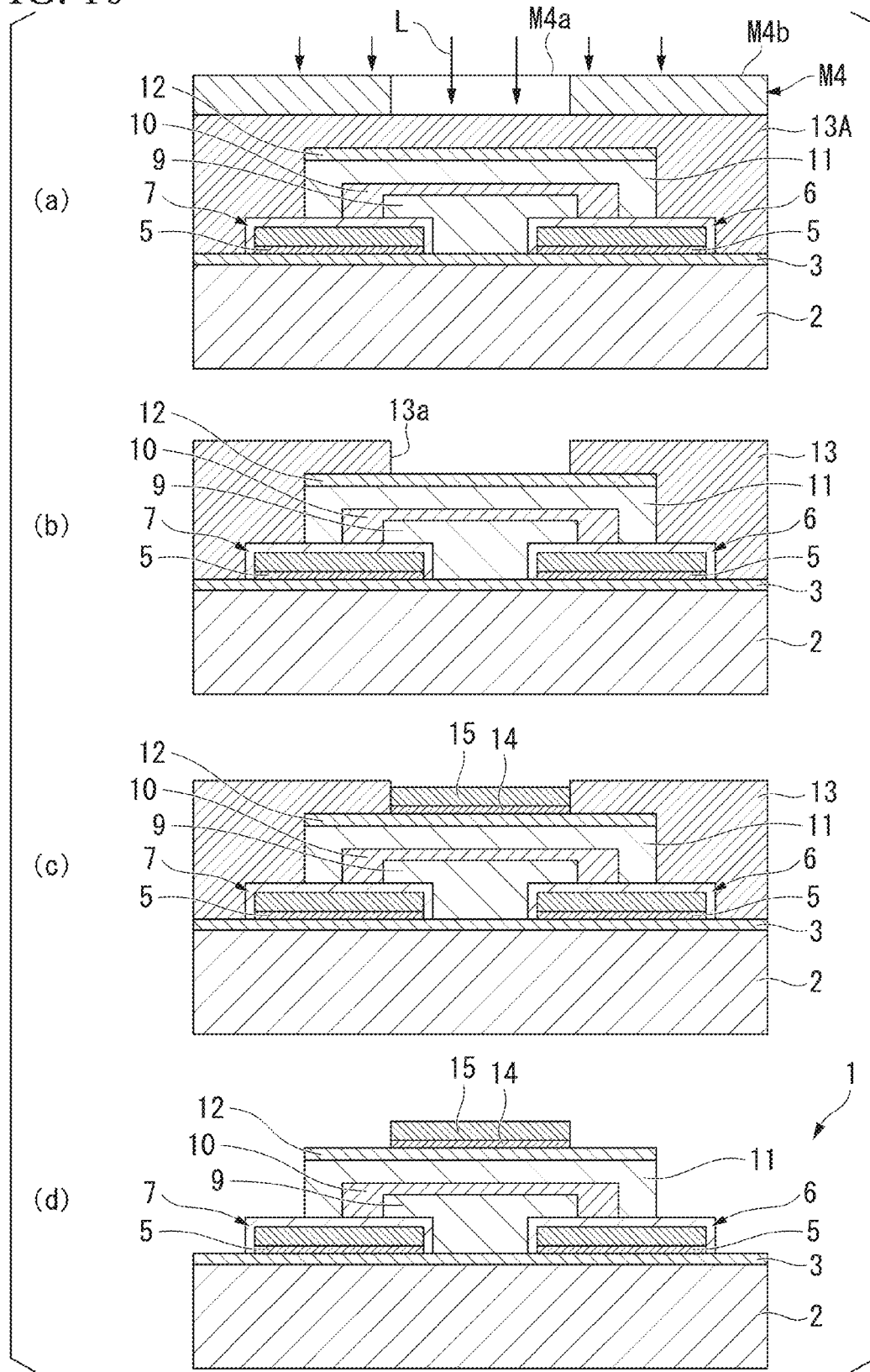
FIG. 10 is a process view showing the transistor manufacturing method of the present embodiment.

Next, as shown in part (a) of FIG. 10, a resist material is applied so as to cover the base film 3, the source electrode 6, the drain electrode 7, the second insulator layer 11, and the base film 12, and the resist material is prebaked to thereby form a resist layer 13A that is not patterned. Here, as the resist material, a positive photoresist is used.

Then, the resist layer 13A is irradiated with ultraviolet light L through a mask M4 that includes an opening part M4a provided at a position corresponding to a region where a gate electrode is formed and that includes a light shielding part M4b provided at a region where the gate electrode is not formed, and the resist layer 13A is exposed.

Next, as shown in part (b) of FIG. 10, the resist layer irradiated with ultraviolet light is developed by a developer that dissolves the resist layer to thereby form a resist layer 13 including an opening part 13a.

Next, as shown in part (c) of FIG. 10, a colloidal solution of a divalent palladium salt is caused to come into contact with the base film 12 exposed through the opening part 13a, and thereby, a catalyst 14 used in electroless plating is deposited on the surface of the base film 12. Then, an electroless plating solution is caused to come into contact with the catalyst 14. Thereby, metal ions dissolved in the electroless plating solution is reduced and deposited on the surface of the catalyst 14, and the gate electrode 15 that includes nickel phosphorus as a formation material is selectively formed in the opening part 13a.

Next, as shown in part (d) of FIG. 10, the entire surface of the remaining resist layer is exposed with ultraviolet light, and then the resist layer is removed by a generally known developer.

In this way, the transistor 1 of the present embodiment can be manufactured.

According to the transistor manufacturing method of the above configuration, when a liquid substance that includes a silane coupling agent is applied to form the base film 12, the second insulator layer 11 that has a higher lyophilic property with respect to the liquid substance than the first insulator layer 10 is preliminarily formed on the surface of the first insulator layer 10 that is formed by a fluorine-containing resin as a formation material. Therefore, the liquid substance is favorably spread on the second insulator layer 11 to well form the base film 12, and a wiring structure can be formed.

Further, the base films 3 and 12 are formed by using a silane coupling agent as a formation material and become smooth films. Therefore, a problem that arises from an uneven shape of the base film does not occur, and it is possible to easily manufacture a high-performance transistor.

Note that, in the present embodiment, a silane coupling agent is used as the formation material of the base films 3 and 12; however, the formation material is not limited thereto. A configuration that includes a resin film and a filler that is dispersed in the resin film can be used as the base films 3 and 12. In such a base film, a fine powder silica or alumina particles can be used as a filler.

In such a base film, a fine uneven shape that is caused by a filler is formed on the surface of the base film. A metal catalyst for electroless plating is deposited on and attached to the uneven part.

When optical transparency is imparted to the transistor 1, a resin material having optical transparency is selected as the formation material of the resin film. Further, particles having an average particle size of 100 nm or less may be used as the filler. A shape such as a granular shape, a rod shape, and a feather shape can be employed as long as the average particle size is 100 nm or less.

Here, the "average particle size" is a value which can be obtained by employing a volume average particle size, an area average particle size, a cumulative median diameter (Median diameter), or the like, using a publicly known method such as a dynamic light scattering method as a measurement principle. Further, when the filler has a variant shape such as the rod shape or the feather shape, the maximum diameter in one particle (size in a longer direction) is the above-described average particle size, and the size in a shorter direction in one particle shows a smaller value than the above-described average particle size.

Further, in the present embodiment, the source electrode 6 and the drain electrode 7 are formed by electroless plating; however, the electrode is not limited thereto. As the source electrode 6 and the drain electrode 7, for example, a metal wiring formed by etching a metal film such as aluminum formed on the surface of the substrate 2, or an electrode formed by applying an electrically-conductive material in a shape of the electrode by a printing technique may be used.

Further, in the present embodiment, the second insulator layer 11 is formed by using an ultraviolet curable epoxy resin; however, the material is not limited thereto. For example, the second insulator layer 11 may be formed by using a heat-curable resin as a formation material of the second insulator layer 11 and forming a monomer or oligomer of the heat-curable resin to be patterned by using a printing technique. As the second insulator layer 11, a material that has insulation properties and is coatable can be used.

Examples of preferable embodiments according to the present invention have been described with reference to the accompanying drawings; however the present invention is not limited to the examples. The shapes, combination, and the like of the components described in the above-mentioned examples are merely examples, and can be variously modified based on design requirements and the like without departing from the scope of the present invention.

For example, a substrate can be made of a non-metallic material. A plurality of plating members in each of which a base film is formed on a PET substrate (non-metallic substrate) are prepared; the plating members are conveyed; and simultaneously in the conveying process, the above-mentioned manufacturing method is used to manufacture a transistor, and thereby, it is possible to form a high-performance transistor on the PET substrate.

Further, it is possible to form a transistor on a PET film according to a roll to roll process in which: a long PET film having flexibility is used as a substrate; a plating member in which a base film is formed on the film is preliminarily wound in a roll form; the plating member is conveyed while being unrolled; transistors are continuously formed using the above-mentioned manufacturing method; and then the manufactured transistors are wound in a roll form.

EXAMPLES

Hereinafter, the present invention will be described with reference to the following Examples, but the scope of the present invention is not limited to the Examples.

Example 1

Fabrication of Source Electrode and Drain Electrode

In the present Example, 3-aminopropyltriethoxysilane (KBE903, manufactured by Shin-Etsu Silicone Co., Ltd.) which is an amine-based silane coupling agent was dissolved in methyl isobutyl ketone (hereinafter, sometimes referred to as MIBK) to have 0.2 mass % to prepare a liquid substance, and the liquid substance was used in forming a base film.

The surface of a PET substrate (Model number: A-4100 (no coat), manufactured by Toyobo Co., Ltd.) was cleaned with atmospheric-pressure oxygen plasma, and then the liquid substance was applied onto the PET substrate by dip coating. The pulling-up speed in the dip coating was 1 mm/sec. Then, the PET substrate was heated at 105° C. for 15 minutes, and a base film was formed.

Then, hexamethyldisilazane (12058-1A, manufactured by Kanto Chemical Co., Inc.) was applied by dip coating (pulling-up speed: 1 mm/sec) on the PET substrate in which the base film was formed. Then, the PET substrate was heated at 105° C. for 10 minutes, and a protection layer was formed.

Next, a resist material (SUMIRESIST PFI-34A6, manufactured by Sumitomo Chemical Co., Ltd.) was applied by dip coating (pulling-up speed: 1 mm/sec) to the PET substrate in which the protection layer of the substrate was formed, and by heating (prebaking) at 105° C. for 5 minutes, a resist layer was formed.

Next, the resist layer was exposed for 2 seconds with ultraviolet light having an intensity of 29 mW/cm$^2$ through a photomask, was heated (post-baked) at 105° C. for 15 minutes, and then was immersed into a 2.38% TMAH solution for 2 minutes. Thereby, a mask pattern was developed in the resist layer, and an opening part was formed.

In the following processes, the above-described conditions were employed for the coating condition, exposure condition, and development condition of a resist material.

Next, the substrate in which the resist layer having an opening part was formed was ultrasonically water-washed at room temperature for 30 seconds, and then was immersed into a catalyst colloidal solution for electroless plating (Melplate activator 7331, manufactured by Meltex Corporation) at room temperature for 60 seconds, and a catalyst was adhered to the base film exposed through the opening part of the resist layer.

Next, the surface was washed with water and then was immersed into an electroless plating solution (Melplate NI-867, manufactured by Meltex Corporation) at 73° C. for 60 seconds to deposit nickel-phosphorus (NiP) on the catalyst adhered to the opening part of the resist layer, and nickel-phosphorus plating was performed.

Next, the surface was water-washed and then was dried, and the entire surface including the remaining resist layer was exposed to ultraviolet light having an intensity of 29 mW/cm$^2$ for 1 minute and then was immersed into ethanol for 1 minute to thereby remove the resist layer.

Next, the surface was water-washed, then was immersed into a gold plating bath for substitution for 1 minute, and further was immersed into a plating bath for reduction for 3 minutes to thereby perform electroless gold plating to coat the surface of the nickel-phosphorus electrode with gold, and a source electrode and a drain electrode were fabricated.

Figure 11:
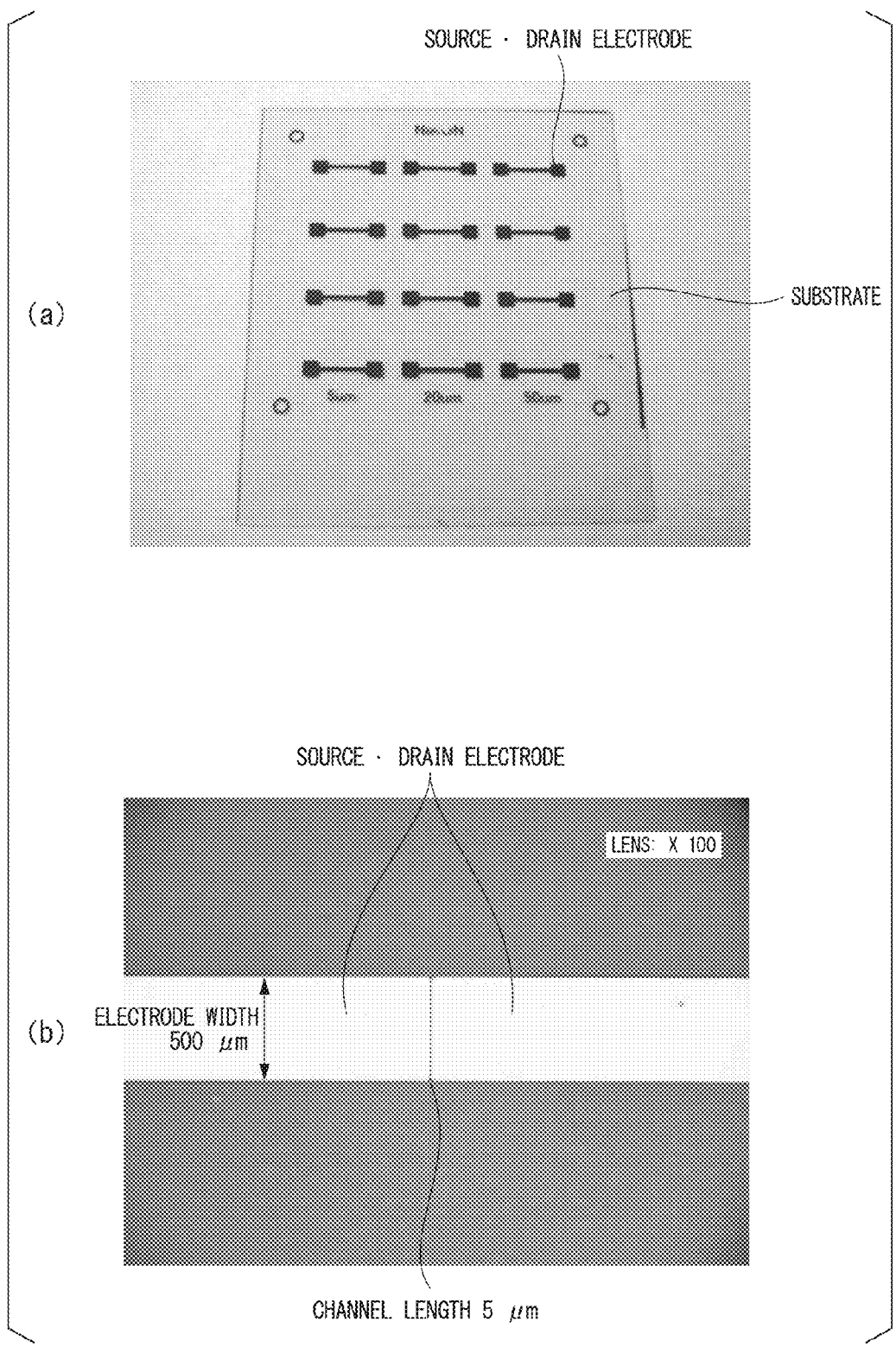
FIG. 11 shows photographs showing the results of Example.

FIG. 11 shows photographs of the source electrode and the drain electrode. Part (a) of FIG. 11 is an entire photograph of the substrate in which the source electrode and the drain electrode were formed, and part (b) of FIG. 11 is an enlarged photograph of the source electrode and the drain electrode by an optical microscope.

As a result of observation, it was confirmed that a source electrode and a drain electrode having a channel length as designed were formed. Further, it was confirmed that flat source and drain electrodes having little unevenness were formed.

(Fabrication of Organic Semiconductor Layer)

A resist material was formed, exposed, and developed according to the above-mentioned conditions, and thereby, the resist layer having an opening part in which the channel region between the source electrode and the drain electrode was exposed was formed. A 2 mass % toluene solution of TIPS pentacene (manufactured by Sigma-Aldrich, Inc.) was applied by dip coating (pulling-up speed: 1 mm/sec) under a nitrogen atmosphere, and natural drying was performed to thereby form a layer of a semiconductor material. The adjustment of the used TIPS pentacene/toluene solution was also performed under a nitrogen atmosphere.

Next, the entire surface of the substrate was exposed to ultraviolet light having an intensity of 29 mW/cm$^2$ for 1 minute and then was immersed into a NaOH aqueous solution having a 50 g/L concentration to remove the resist layer.

Next, the surface was water-washed and dried, and thereby, an organic semiconductor layer that came into contact with the surfaces of the source electrode and the drain electrode was formed to be patterned.

Figure 12:
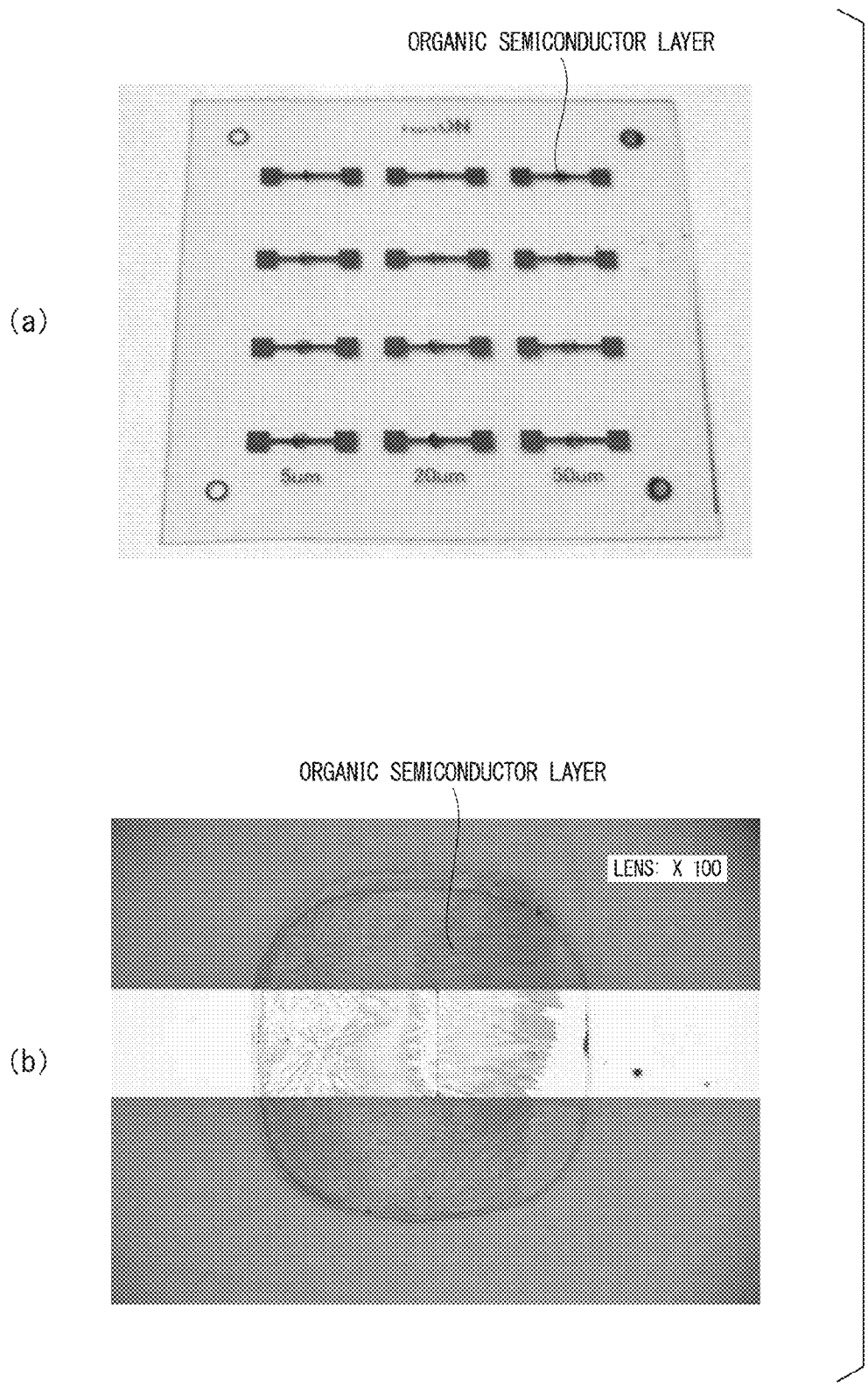
FIG. 12 shows photographs showing the results of Example.

FIG. 12 shows enlarged photographs of the source electrode and the drain electrode having a surface on which the organic semiconductor layer was formed. Part (a) of FIG. 12 is an entire photograph, and part (b) of FIG. 12 is an enlarged photograph by an optical microscope and is a photograph corresponding to FIG. 11.

As a result of observation, it was confirmed that crystals of TIPS pentacene were formed between the source electrode and the drain electrode.

(Fabrication of First Insulator Layer and Second Insulator Layer)

A 0.9 mass % CYTOP solution (CYTOP: CTX-109A, solvent: CT-Solv. 100E, manufactured by Asahi Glass Co., Ltd.) as a formation material of a fluorine-containing resin was formed by drop casting on the above-mentioned organic semiconductor layer. Next, the solvent was volatilized by heating at 105° C. for 30 minutes, and the first insulator layer was formed. The thickness of the first insulator layer was 1 µm.

Next, the surface of the first insulator layer was treated by using atmospheric pressure oxygen plasma for 10 seconds, and the surface of the first insulator layer was modified.

Next, dip coating (pulling-up speed: 1 mm/sec) was performed by using a 20 mass % SU-8 (manufactured by Nippon Kayaku Co., Ltd.) as an ultraviolet curable resin formed mainly by an epoxy resin, heating (prebaking) was performed at 105° C. for 10 minutes, and a coating film of an ultraviolet curable resin was formed.

Next, the entire surface of the substrate was irradiated for 5 seconds with ultraviolet light having an intensity of 29 mW/cm$^2$ through a mask having an opening part at a region including the first insulator layer in plan view.

After a thermal process (post-baking) was performed at 105° C. for 30 minutes in order to accelerate curing, the ultraviolet curable resin was immersed in a PEGMEA developer and was patterned. After the patterning, a thermal process was performed at 105° C. for 20 minutes, and the second insulator layer was formed. The thickness of the second insulator layer was 1 µm.

Figure 13:
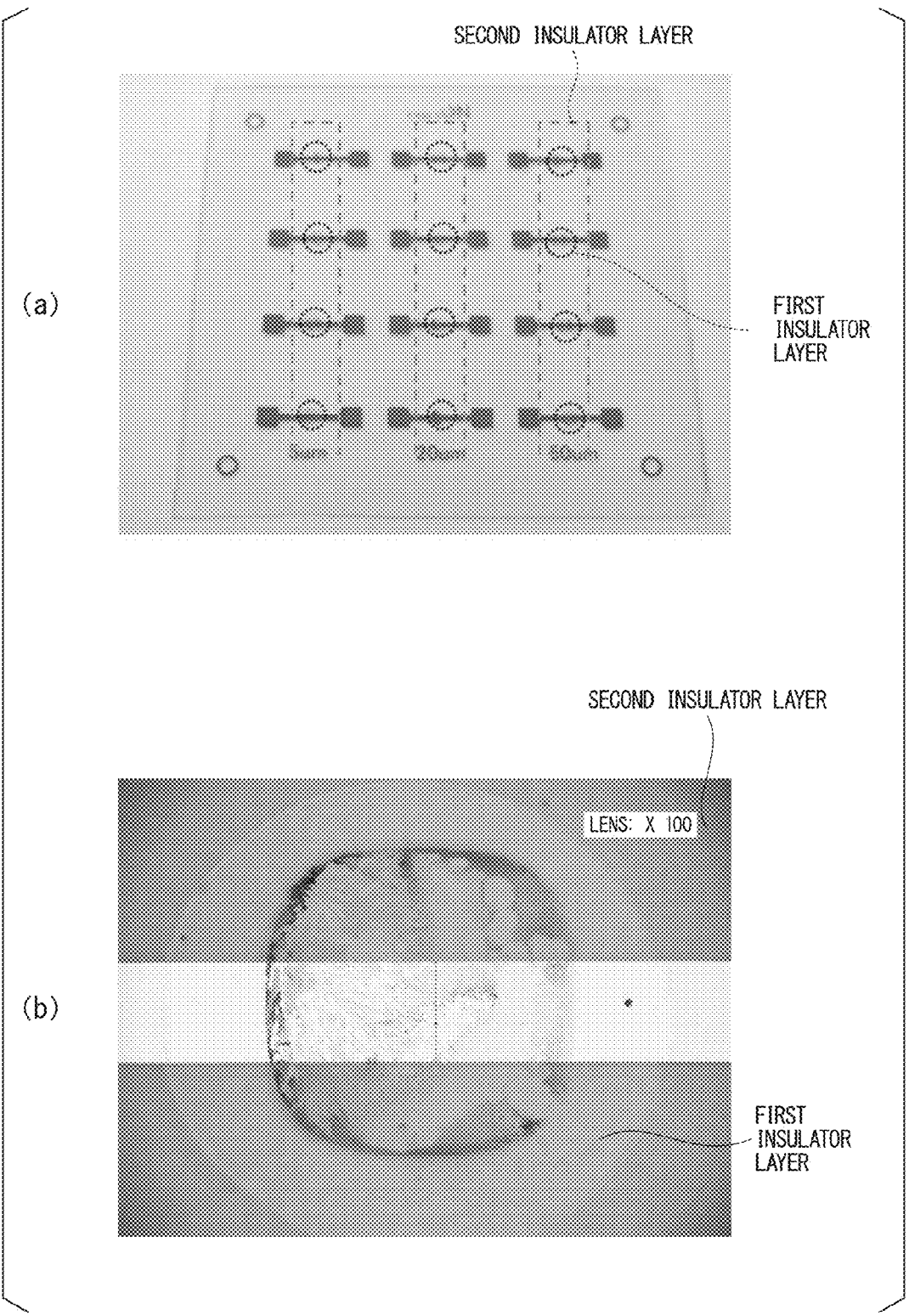
FIG. 13 shows photographs showing the results of Example.

FIG. 13 is a photograph of the first insulator layer and the second insulator layer. Part (a) of FIG. 13 is an entire photograph, and part (b) of FIG. 13 is an enlarged photograph by an optical microscope and is a photograph corresponding to FIG. 11. As shown in the drawing, a band-shaped second insulator layer was provided commonly to a plurality of source electrodes and drain electrodes arranged in one direction on the substrate.

As a result of observation, it was confirmed that the outline of the organic semiconductor was not blurred and was not broadened, and the organic semiconductor layer was not dissolved when the first insulator layer was formed. Further, it was confirmed that the second insulator layer was well formed without being repelled at the surface of the first insulator layer and without causing coating unevenness.

(Fabrication of Gate Electrode)

After a plasma process was applied on the surface of the substrate on which the second semiconductor layer was formed by using atmospheric pressure oxygen plasma, fabrication of the base film and the resist layer and electroless plating were performed by the same method as described above (fabrication of the source electrode and the drain electrode), and a patterned gate electrode was formed on the second insulator layer.

Figure 14:
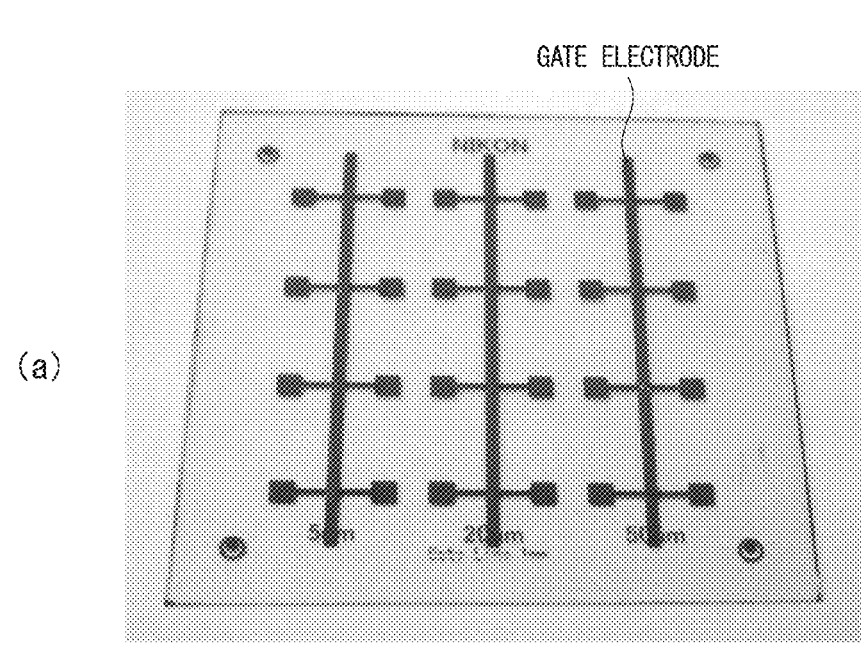
FIG. 14 shows photographs showing the results of Example.
Figure 14:
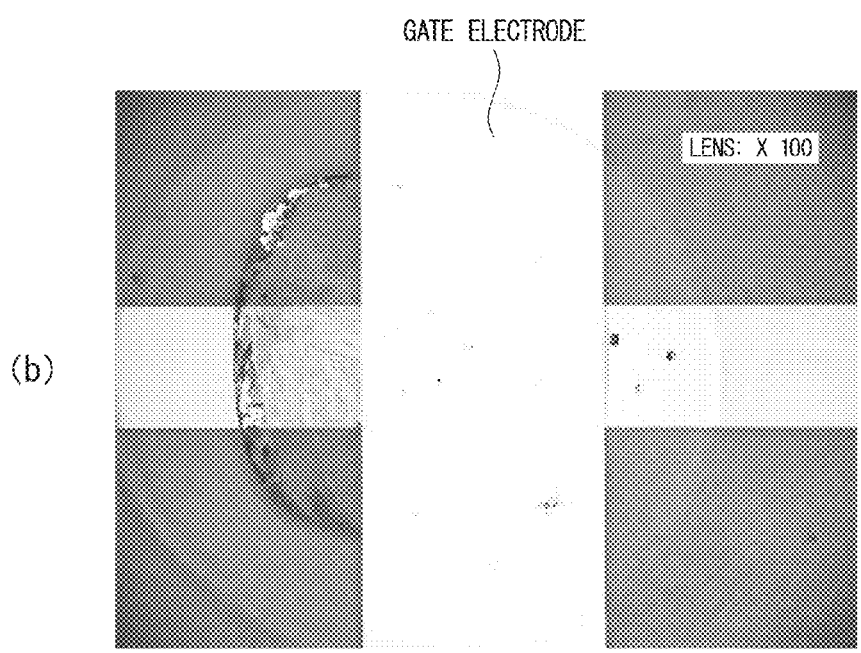

FIG. 14 is a photograph of the gate electrode. Part (a) of FIG. 14 is an entire photograph, and part (b) of FIG. 14 is an enlarged photograph by an optical microscope and is a photograph corresponding to FIG. 11.

As a result of observation, it was confirmed that a gate electrode was well formed on the surface of the second insulator layer. Further, a breakage of the second insulator layer at the electroless plating process was not confirmed.

As described above, the transistor 1 of the present Example was fabricated.

(Evaluation of Transistor)

The transistor characteristics of the fabricated transistor 1 were evaluated using a semiconductor parameter analyzer (4200-SCS, manufactured by KEITHLEY Co., Ltd.).

Figure 15:
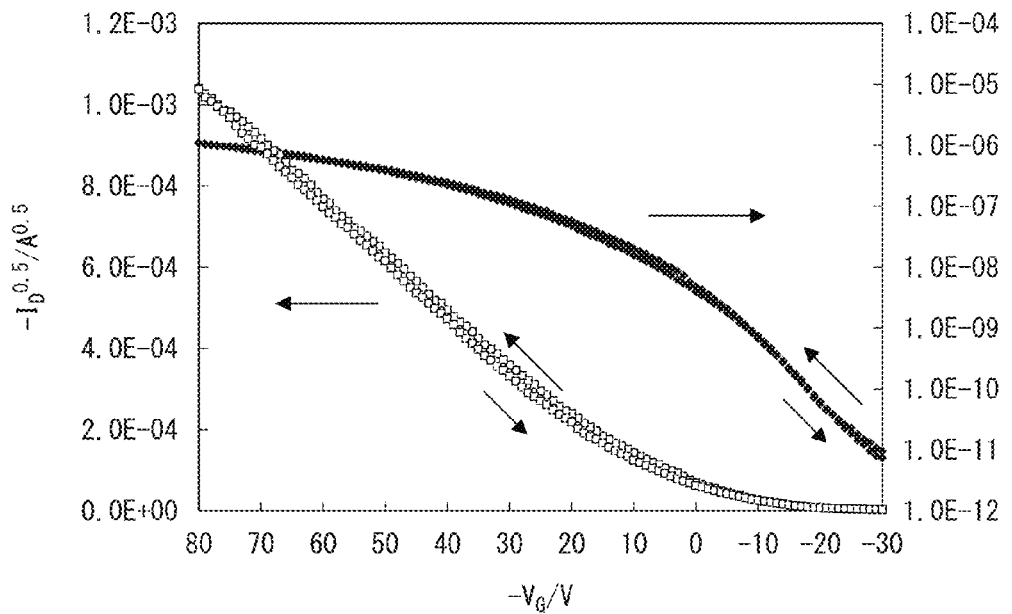
FIG. 15 shows graphs showing the results of Example.
Figure 15:
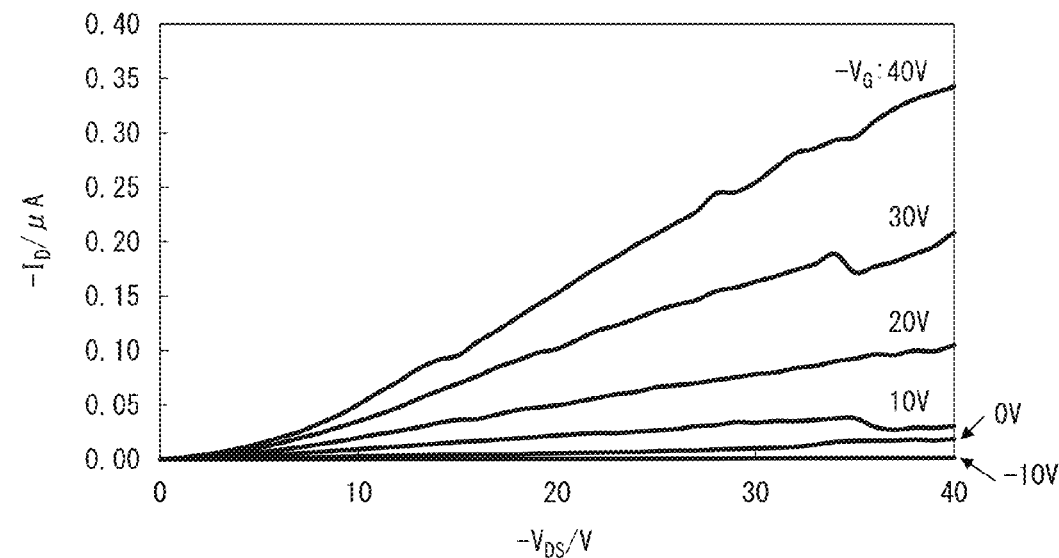

FIG. 15 is a graph showing the transistor characteristics of the transistor 1 of Example 1.

In each of the graphs of FIG. 15, for ease of understanding of the drawing, the gate voltage ($V_G$) of true value, which is a negative value, is multiplied by −1, and thereby, is expressed as a positive value. With respect to the true value of the gate voltage, the positive value (a value corresponding to the gate voltage) used in the notation is expressed by "$-V_G$".

Similarly, the voltage ($V_{DS}$) between the source and the drain is expressed by using a value "$-V_{DS}$" as the corresponding positive value.

Further, the current value detected by the drain electrode to be measured is also expressed by using a value "$-I_D$" as the corresponding positive value.

Part (a) of FIG. 15 is a graph showing a transfer property of the transistor 1. In the graph of part (a) of FIG. 15, the horizontal axis indicates a voltage applied to the gate electrode, and the vertical axis indicates a current value detected by a drain electrode.

After a gate voltage was applied to the gate electrode of the obtained transistor 1 while increasing the gate voltage from −80 V to 30 V (positive sweep), a gate voltage was applied while decreasing the gate voltage from 30 V to −80 V (inverse sweep), and a current value versus a voltage was measured. At that time, a constant voltage of −30 V was applied between the source and the drain, and an electric current was caused to flow.

As a result of measurement, in the transistor 1 of the present Example, a difference in a drain current between at the time of the positive sweep and at the time of the inverse sweep was not found, and a hysteresis was not observed.

Further, in the graph of part (b) of FIG. 15, the horizontal axis indicates a voltage applied between the source and the drain, and the vertical axis indicates a current value detected by the drain electrode. One of a plurality of results shown in the drawing corresponds to each of gate voltages applied to the gate electrode.

A gate voltage of −10 V to −40 V was applied to the gate electrode of the obtained transistor 1, a voltage of 0 V to −40 V was applied between the source and the drain, and an electric current was caused to flow. As a result, as shown in the drawing, holes were induced in the channel region (between the source and the drain) of the semiconductor layer, and the fabricated transistor 1 was operated as a p-type transistor. Further, the transistor 1 exhibited characteristics of a mobility: $6 \times 10^{-3}$ cm$^2$/Vs and an On/Off ratio: $1.1 \times 10^5$.

Comparative Example 1

Figure 16:
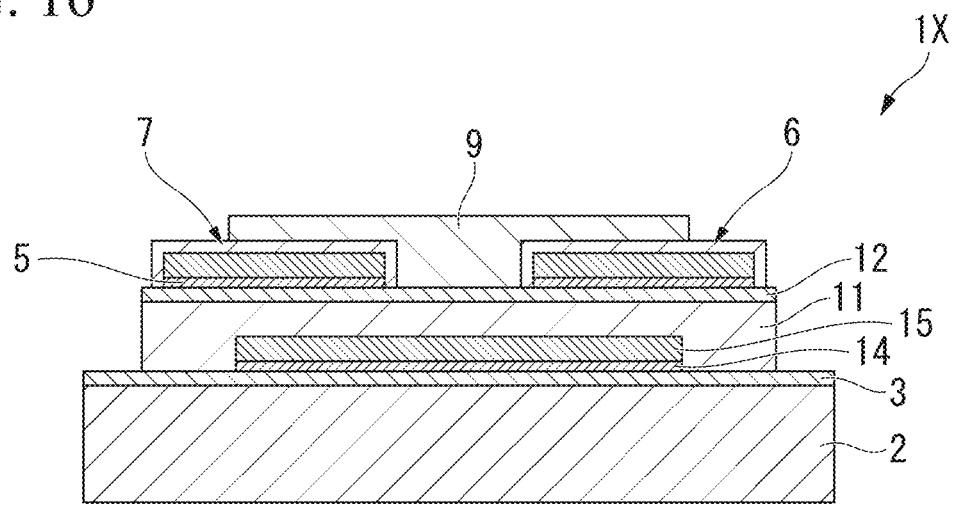
FIG. 16 is a schematic cross-sectional view of a transistor formed as Comparative Example.

FIG. 16 is a cross-sectional view showing a transistor 1X formed as Comparative Example 1 and is a drawing corresponding to FIG. 1. In FIG. 16, a configuration that is common to the transistor 1 shown in FIG. 1 is indicated by the same reference numeral.

The transistor 1X shown in FIG. 16 includes a substrate 2, a base film 3, a catalyst 5 for electroless plating, a source electrode 6, a drain electrode 7, an organic semiconductor layer (semiconductor layer) 9, a second insulator layer 11, a base film 12, a catalyst 14 for electroless plating, and a gate electrode 15.

In the transistor 1X, the base film 3 is formed on the surface of the substrate 2, and the catalyst 14 and the gate electrode 15 that is laminated on the catalyst 14 are provided on part of the base film 3. The gate electrode 15 is covered by the second insulator layer 11. The base film 12 is formed on the entire upper surface of the second insulator layer 11. On part of the base film 12, the source electrode 6 that is laminated on the catalyst 5 is provided at one position, and the drain electrode 7 that is laminated on the catalyst 5 is provided at another position. The semiconductor layer 9 is provided so as to overlap the source electrode 6 and the drain electrode 7.

Such a transistor 1X was formed as described below.

(Fabrication of Gate Electrode)

A gate electrode was fabricated by the same sequence as the gate electrode of Example 1.

(Fabrication of Second Insulator Layer)

After the surface of the fabricated gate electrode was cleaned by atmospheric pressure oxygen plasma, a photosensitive PVP resin solution was applied by dip coating (pulling-up speed: 1 mm/sec).

As the photosensitive PVP resin solution, a cyclohexanone solution of the following (a)~(e) was used.

(a) PVP (manufactured by Sigma-Aldrich Company Ltd.)

(b) tetraphenyl all ethane glycidyl ether (manufactured by Sigma-Aldrich Company, Ltd.)

(c) tris (4-hydroxyphenyl) methane triglycidyl ether (manufactured by Sigma-Aldrich Company, Ltd.)

(d) bisphenol A epoxy (RE-310s; manufactured by Nippon Kayaku Co., Ltd.)

(e) photo cationic polymerization initiator (triaryl sulfonium hexafluoroantimonate mixture, 50% in propylene carbonate (manufactured by Sigma-Aldrich Company, Ltd.))

In the photosensitive PVP resin solution, the mass ratio was (a):(b):(c):(d)=2:5:2:1, and (e) was added by 3.5 mass % with respect to the total amount of the resin components ((a) to (d)). Further, the concentration of the resin components was 20 mass %.

The photosensitive PVP resin solution was applied, then was prebaked at 105° C. for 10 minutes, and was irradiated for 30 seconds with ultraviolet light through a mask having an opening part at a region to be formed. After heating (post-baking) at 105° C. for 60 minutes in order to accelerate curing, the insulator resin was immersed in an acetone developer and was patterned. After the patterning, a thermal process was performed at 105° C. for 20 minutes as a main curing, and the second insulator layer was formed. The thickness of the formed insulator layer was 1 μm.

(Fabrication of Source Electrode and Drain Electrode)

A source electrode and a drain electrode were fabricated by the same sequence as those of Example 1.

(Fabrication of Organic Semiconductor Layer)

An organic semiconductor layer was fabricated by the same sequence as that of Example 1.

Figure 17:
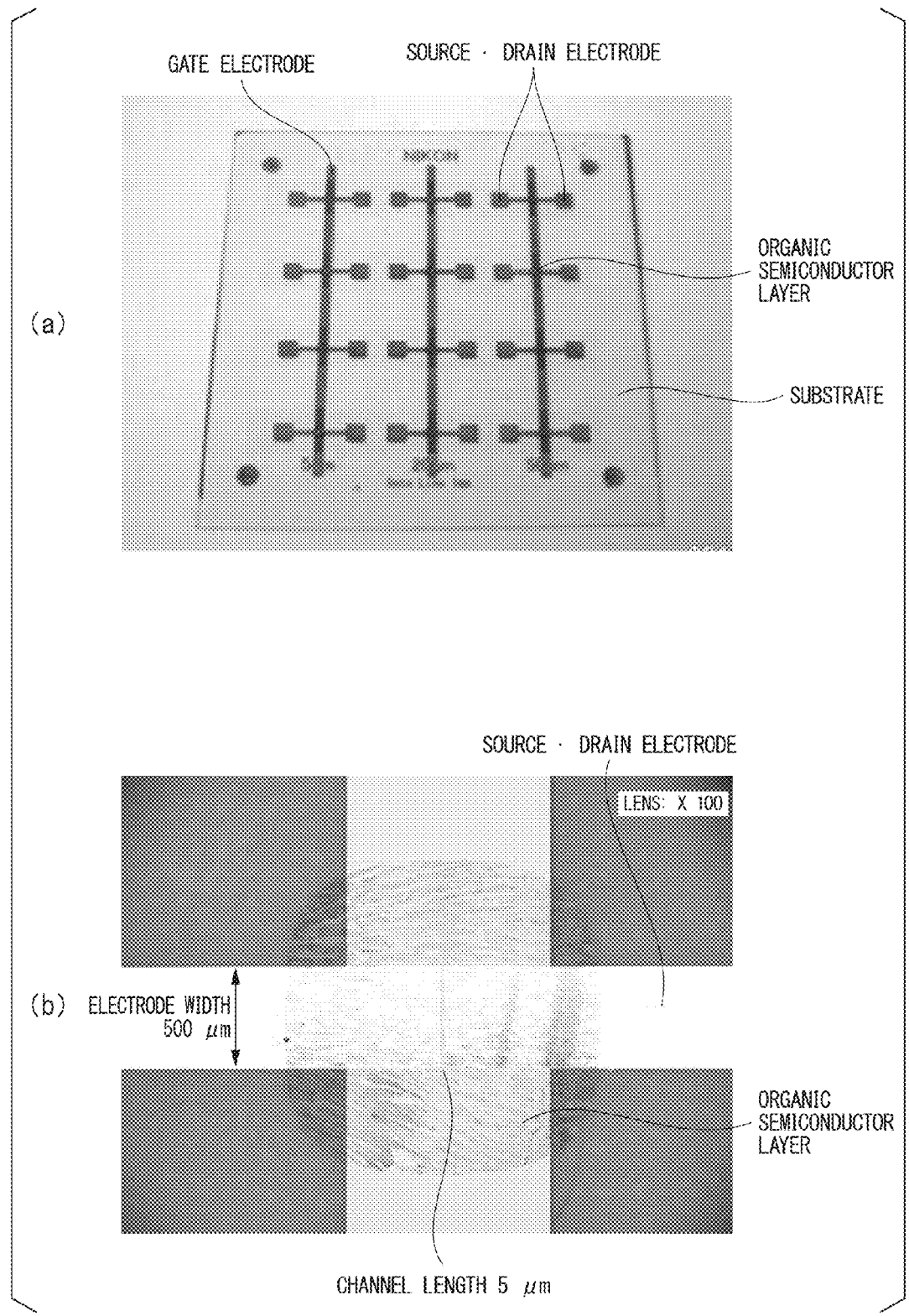
FIG. 17 shows photographs showing the results of Comparative Example.

FIG. 17 is a photograph of the fabricated transistor 1X. Part (a) of FIG. 17 is an entire photograph, and part (b) of FIG. 17 is an enlarged photograph by an optical microscope and is a photograph corresponding to FIG. 14.

As a result of observation, it was confirmed that the electrodes were well formed and crystals of TIPS pentacene were formed between the source electrode and the drain electrode.

(Evaluation of Transistor)

The transistor characteristics of the fabricated transistor 1X were evaluated using a semiconductor parameter analyzer (4200-SCS, manufactured by KEITHLEY Co., Ltd.) similarly to Example 1.

Figure 18:
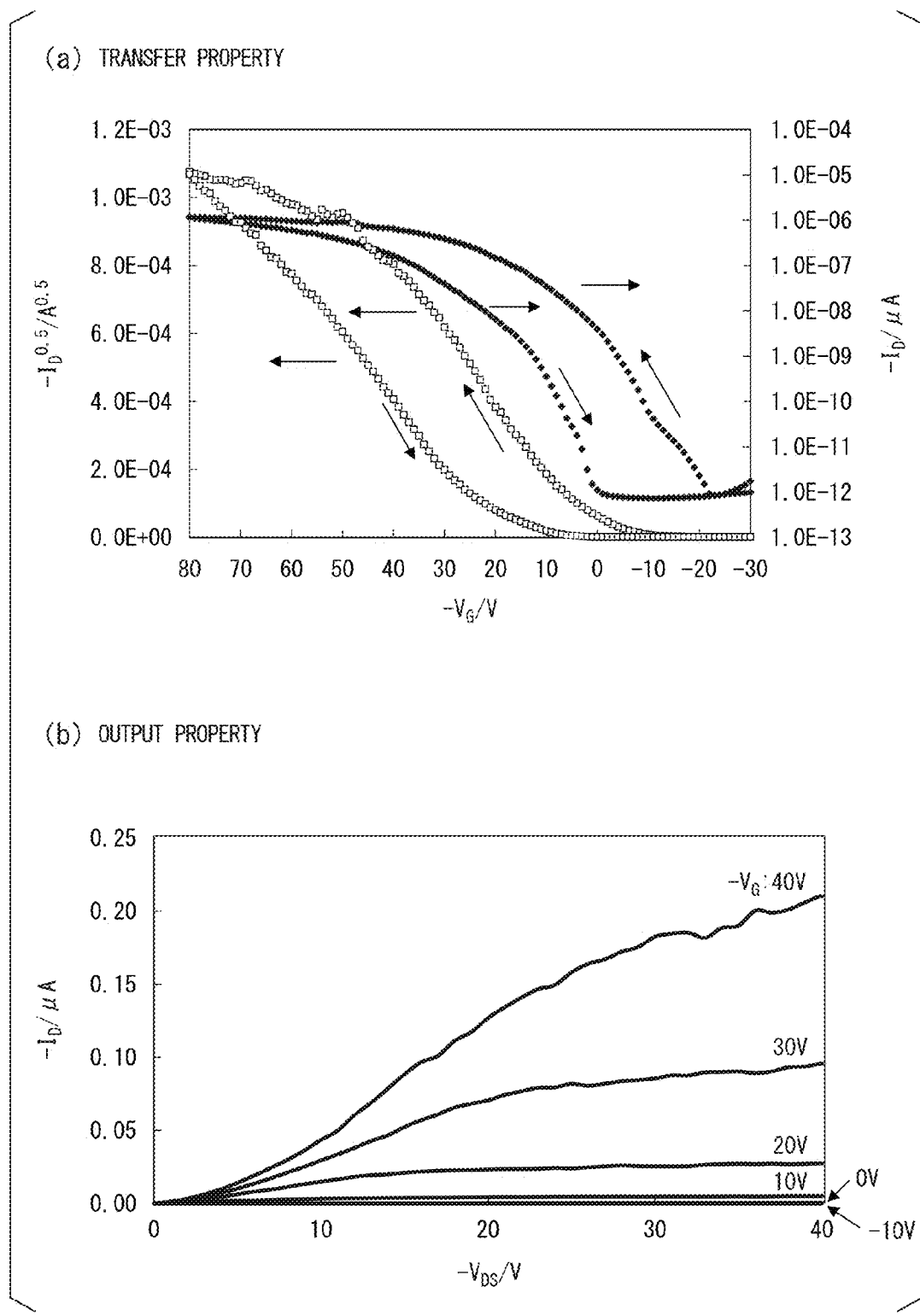
FIG. 18 shows graphs showing the results of Comparative Example.

FIG. 18 is a graph showing the transistor characteristics of the transistor 1X of Comparative Example 1. Part (a) of FIG. 18 is a graph showing a transfer property of the transistor 1X, and part (b) of FIG. 18 is a graph showing an output property of the transistor 1X and is a graph corresponding to FIG. 15. The vertical axis and the horizontal axis in each of the graphs of FIG. 18 are the same as those of FIG. 15.

As shown in part (a) of FIG. 18, in the transistor 1X of Comparative Example, a difference in a drain current between at the time of the positive sweep and at the time of the inverse sweep was found, and a hysteresis was observed.

Further, as shown in part (b) of FIG. 18, the fabricated transistor 1X was operated as a p-type transistor. Further, the transistor 1 exhibited characteristics of a mobility: $1\times10^{-3}$ cm$^2$/Vs and an On/Off ratio: $1.4\times10^6$.

From the results described above, it was found that a hysteresis in the transfer property was not observed, and the transistor according to the embodiment of the present invention can be stably operated.

From the above results, the usefulness of the present invention has been confirmed.

What is claimed is:

1. A transistor manufacturing method comprising:
    forming a first insulator layer of which formation material is a fluorine-containing resin, on a substrate on which a source electrode, a drain electrode, and an organic semiconductor layer that comes into contact with surfaces of the source electrode and the drain electrode are formed so as to cover the organic semiconductor layer;
    forming a second insulator layer so as to cover the first insulator layer;
    forming a plating base film on at least part of a surface of the second insulator layer; and
    after depositing a metal which is an electroless plating catalyst on a surface of the plating base film, forming a gate electrode on the surface of the plating base film by electroless plating, wherein
    the forming of the plating base film is performed by applying a liquid substance which is a formation material of the plating base film to the surface of the second insulator layer, and
    the second insulator layer has a higher lyophilic property with respect to the liquid substance than the first insulator layer.

2. The transistor manufacturing method according to claim 1, wherein
    the forming of the first insulator layer is performed by applying a solution including the fluorine-containing resin and a fluorine-containing solvent that dissolves the fluorine-containing resin, on a surface of the organic semiconductor layer.

3. The transistor manufacturing method according to claim 1, wherein
    in the forming of the first insulator layer, the first insulator layer is formed so as to entirely cover the an upper surface and a lateral surface of the organic semiconductor layer.

4. The transistor manufacturing method according to claim 1, wherein
    the liquid substance includes a silane coupling agent, and the silane coupling agent includes a group having at least one of a nitrogen atom and a sulfur atom.

5. The transistor manufacturing method according to claim 4, wherein
    the silane coupling agent has an amino group.

6. The transistor manufacturing method according to claim 5, wherein
    the silane coupling agent is a primary amine or a secondary amine.

7. The transistor manufacturing method according to claim 1, wherein
    the liquid substance includes a solution in which a resin material is dissolved and a filler that is dispersed in the solution.

8. The transistor manufacturing method according to claim 1, wherein
    the substrate is made of a non-metallic material.

9. The transistor manufacturing method according to claim 8, wherein
    the substrate is made of a resin material.

10. The transistor manufacturing method according to claim 9, wherein
    the substrate has flexibility.

11. A transistor comprising:
    a substrate on which a source electrode and a drain electrode are formed;
    a semiconductor layer that comes into contact with surfaces of the source electrode and the drain electrode;
    a first insulator layer that is provided so as to cover the semiconductor layer;
    a second insulator layer that is provided so as to cover the first insulator layer;
    a plating base film that is provided on at least part of a surface of the second insulator layer; and
    a gate electrode that is provided on a surface of the plating base film, wherein
    a formation material of the first insulator layer is a fluorine-containing resin, and
    the second insulator layer has a higher lyophilic property with respect to an organic solvent than the first insulator layer.

12. The transistor according to claim 11, wherein
    the plating base film includes a silane coupling agent, and the silane coupling agent includes a group having at least one of a nitrogen atom and a sulfur atom.

13. The transistor according to claim 11, wherein
    the plating base film includes a resin film and a filler that is dispersed in the resin film.

14. The transistor according to claim 11, wherein
    the semiconductor layer is an organic semiconductor layer.

15. The transistor according to claim 11, which is formed on a substrate that is made of a non-metallic material.

16. The transistor according to claim 15, wherein
    the substrate is made of a resin material.

17. The transistor according to claim 16, wherein
    the substrate has flexibility.

* * * * *